(12) United States Patent
Lo et al.

(10) Patent No.: US 12,726,389 B2
(45) Date of Patent: Sep. 1, 2026

(54) PULSE AMPLITUDE MODULATION WITH BOUNDED DISPARITY

(71) Applicant: Axonne, Inc., Sunnyvale, CA (US)

(72) Inventors: William Lo, Cupertino, CA (US); Saman Behtash, Palo Alto, CA (US)

(73) Assignee: Axonne, Inc., Sunnyvale, CA (US)

(*) Notice: Subject to any disclaimer, the term of this patent is extended or adjusted under 35 U.S.C. 154(b) by 42 days.

(21) Appl. No.: 19/018,939

(22) Filed: Jan. 13, 2025

(65) Prior Publication Data

US 2025/0293905 A1 Sep. 18, 2025

Related U.S. Application Data

(60) Provisional application No. 63/620,374, filed on Jan. 12, 2024.

(51) Int. Cl.
*H04L 25/49* (2006.01)
*H03M 7/20* (2006.01)

(52) U.S. Cl.
CPC .......... *H04L 25/4906* (2013.01); *H03M 7/20* (2013.01)

(58) Field of Classification Search
CPC ............................ H04L 25/4906; H03M 7/20
See application file for complete search history.

(56) References Cited

U.S. PATENT DOCUMENTS

2009/0282316 A1* 11/2009 Lingam .................. H03M 13/11 714/763
2016/0378594 A1* 12/2016 Motwani ............ H03M 13/1171 714/764
2025/0183913 A1* 6/2025 Melton ................. H03M 13/31

* cited by examiner

*Primary Examiner* — Sung S Ahn
(74) *Attorney, Agent, or Firm* — Harness, Dickey & Pierce, P.L.C.

(57) ABSTRACT

A communications device includes a mapping module mapping a plurality of n-bit signals to a plurality of (n+1)/2 symbols using a first or second set of symbols having a positive or negative disparity. An encoder a) selects the first set of symbols or the second set of symbols as a next symbol set of the mapping module; b) encodes a first one of the plurality of n-bit signals using the next symbol set of the mapping module; c) calculates a running disparity; d) if the running disparity is greater than zero, selects the second set of symbols of the mapping module as the next symbol set; and e) if the running disparity is less than zero, selects the first set of symbols of the mapping module as the next symbol set.

40 Claims, 18 Drawing Sheets

Voltage
Maximum allowed output voltage
Maximum allowed supply voltage
PAM4 Signal
time Voltage
74
70
Maximum allowed output voltage
Maximum allowed supply voltage
time

| r[4:2] | 0 | 1 | 2 | 3 | 4 | 5 | 6 | 7 |
|---|---|---|---|---|---|---|---|---|
| L[2] | 1 | 1 | 1 | 1 | 3 | 3 | 3 | 3 |
| L[1] | 1 | 1 | 3 | 3 | 1 | 1 | 3 | 3 |
| L[0] | 1 | 3 | 1 | 3 | 1 | 3 | 1 | 3 |

| Q[2:0] | r[4:2] | | | | | | | |
|---|---|---|---|---|---|---|---|---|
| r[1:0] | 0 | 1 | 2 | 3 | 4 | 5 | 6 | 7 |
| 0 | 0 | 0 | 0 | 0 | 0 | 0 | 0 | 0 |
| 1 | 1 | 1 | 1 | 1 | 1 | 1 | 1 | 1 |
| 2 | 2 | 2 | 2 | 2 | 2 | 2 | 2 | 2 |
| 3 | 3 | 3 | 3 | 3 | 3 | 3 | 3 | 3 |

| disparity | r[4:2] | | | | | | | |
|---|---|---|---|---|---|---|---|---|
| r[1:0] | 0 | 1 | 2 | 3 | 4 | 5 | 6 | 7 |
| 0 | 3 | 5 | 5 | 7 | 5 | 7 | 7 | 9 |
| 1 | 1 | -1 | 3 | 1 | 3 | 1 | 5 | 3 |
| 2 | 1 | 3 | -1 | 1 | 3 | 5 | 1 | 3 |
| 3 | -1 | -3 | -3 | -5 | 1 | -1 | -1 | -3 |

| Q[2:0] | r[4:2] | | | | | | | |
|---|---|---|---|---|---|---|---|---|
| r[1:0] | 0 | 1 | 2 | 3 | 4 | 5 | 6 | 7 |
| 0 | 0 | 0 | 0 | 0 | 0 | 0 | 0 | 0 |
| 1 | 1 | 6 | 1 | 1 | 1 | 1 | 1 | 1 |
| 2 | 2 | 2 | 5 | 2 | 2 | 2 | 2 | 2 |
| 3 | 4 | 4 | 4 | 4 | 3 | 4 | 4 | 4 |

| disparity | r[4:2] | | | | | | | |
|---|---|---|---|---|---|---|---|---|
| r[1:0] | 0 | 1 | 2 | 3 | 4 | 5 | 6 | 7 |
| 0 | 3 | 5 | 5 | 7 | 5 | 7 | 7 | 9 |
| 1 | 1 | 1 | 3 | 1 | 3 | 1 | 5 | 3 |
| 2 | 1 | 3 | 1 | 1 | 3 | 5 | 1 | 3 |
| 3 | 1 | 3 | 3 | 5 | 1 | 1 | 1 | 3 |

| Q[2:0] | r[4:2] | | | | | | | |
|---|---|---|---|---|---|---|---|---|
| r[1:0] | 0 | 1 | 2 | 3 | 4 | 5 | 6 | 7 |
| 0 | 7 | 7 | 7 | 7 | 7 | 7 | 7 | 7 |
| 1 | 6 | 1 | 6 | 6 | 6 | 6 | 6 | 6 |
| 2 | 5 | 5 | 2 | 5 | 5 | 5 | 5 | 5 |
| 3 | 3 | 3 | 3 | 3 | 4 | 3 | 3 | 3 |

FIG. 13

| | r[4:2] => L[2:0] | | | r[4:0] => Q[2:0] | | | NS = P | | | NS = N | | |
|---|---|---|---|---|---|---|---|---|---|---|---|---|
| r[4:0] | L[2] | L[1] | L[0] | Q[2] | Q[1] | Q[0] | S[2] | S[1] | S[0] | S[2] | S[1] | S[0] |
| 0 | 1 | 1 | 1 | 1 | 1 | 1 | 1 | 1 | 1 | -1 | -1 | -1 |
| 1 | 1 | 1 | 1 | 1 | 1 | -1 | 1 | 1 | -1 | -1 | -1 | 1 |
| 2 | 1 | 1 | 1 | 1 | -1 | 1 | 1 | -1 | 1 | -1 | 1 | -1 |
| 3 | 1 | 1 | 1 | -1 | 1 | 1 | -1 | 1 | 1 | 1 | -1 | -1 |
| 4 | 1 | 1 | 3 | 1 | 1 | 1 | 1 | 1 | 3 | -1 | -1 | -3 |
| 5 | 1 | 1 | 3 | -1 | -1 | 1 | -1 | -1 | 3 | 1 | 1 | -3 |
| 6 | 1 | 1 | 3 | 1 | -1 | 1 | 1 | -1 | 3 | -1 | 1 | -3 |
| 7 | 1 | 1 | 3 | -1 | 1 | 1 | -1 | 1 | 3 | 1 | -1 | -3 |
| 8 | 1 | 3 | 1 | 1 | 1 | 1 | 1 | 3 | 1 | -1 | -3 | -1 |
| 9 | 1 | 3 | 1 | 1 | 1 | -1 | 1 | 3 | -1 | -1 | -3 | 1 |
| 10 | 1 | 3 | 1 | -1 | 1 | -1 | -1 | 3 | -1 | 1 | -3 | 1 |
| 11 | 1 | 3 | 1 | -1 | 1 | 1 | -1 | 3 | 1 | 1 | -3 | -1 |
| 12 | 1 | 3 | 3 | 1 | 1 | 1 | 1 | 3 | 3 | -1 | -3 | -3 |
| 13 | 1 | 3 | 3 | 1 | 1 | -1 | 1 | 3 | -3 | -1 | -3 | 3 |
| 14 | 1 | 3 | 3 | 1 | -1 | 1 | 1 | -3 | 3 | -1 | 3 | -3 |
| 15 | 1 | 3 | 3 | -1 | 1 | 1 | -1 | 3 | 3 | 1 | -3 | -3 |
| 16 | 3 | 1 | 1 | 1 | 1 | 1 | 3 | 1 | 1 | -3 | -1 | -1 |
| 17 | 3 | 1 | 1 | 1 | 1 | -1 | 3 | 1 | -1 | -3 | -1 | 1 |
| 18 | 3 | 1 | 1 | 1 | -1 | 1 | 3 | -1 | 1 | -3 | 1 | -1 |
| 19 | 3 | 1 | 1 | 1 | -1 | -1 | 3 | -1 | -1 | -3 | 1 | 1 |
| 20 | 3 | 1 | 3 | 1 | 1 | 1 | 3 | 1 | 3 | -3 | -1 | -3 |
| 21 | 3 | 1 | 3 | 1 | 1 | -1 | 3 | 1 | -3 | -3 | -1 | 3 |
| 22 | 3 | 1 | 3 | 1 | -1 | 1 | 3 | -1 | 3 | -3 | 1 | -3 |
| 23 | 3 | 1 | 3 | -1 | 1 | 1 | -3 | 1 | 3 | 3 | -1 | -3 |
| 24 | 3 | 3 | 1 | 1 | 1 | 1 | 3 | 3 | 1 | -3 | -3 | -1 |
| 25 | 3 | 3 | 1 | 1 | 1 | -1 | 3 | 3 | -1 | -3 | -3 | 1 |
| 26 | 3 | 3 | 1 | 1 | -1 | 1 | 3 | -3 | 1 | -3 | 3 | -1 |
| 27 | 3 | 3 | 1 | -1 | 1 | 1 | -3 | 3 | 1 | 3 | -3 | -1 |
| 28 | 3 | 3 | 3 | 1 | 1 | 1 | 3 | 3 | 3 | -3 | -3 | -3 |
| 29 | 3 | 3 | 3 | 1 | 1 | -1 | 3 | 3 | -3 | -3 | -3 | 3 |
| 30 | 3 | 3 | 3 | 1 | -1 | 1 | 3 | -3 | 3 | -3 | 3 | -3 |
| 31 | 3 | 3 | 3 | -1 | 1 | 1 | -3 | 3 | 3 | 3 | -3 | -3 |

FIG. 14

| r[6:3] | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| L[3] | 1 | 1 | 1 | 1 | 1 | 1 | 1 | 1 | 3 | 3 | 3 | 3 | 3 | 3 | 3 | 3 |
| L[2] | 1 | 1 | 1 | 1 | 3 | 3 | 3 | 3 | 1 | 1 | 1 | 1 | 3 | 3 | 3 | 3 |
| L[1] | 1 | 1 | 3 | 3 | 1 | 1 | 3 | 3 | 1 | 1 | 3 | 3 | 1 | 1 | 3 | 3 |
| L[0] | 1 | 3 | 1 | 3 | 1 | 3 | 1 | 3 | 1 | 3 | 1 | 3 | 1 | 3 | 1 | 3 |

FIG. 15

| Q[3:0] | r[6:3] | | | | | | | | | | | | | | | |
|---|---|---|---|---|---|---|---|---|---|---|---|---|---|---|---|---|
| r[2:0] | 0 | 1 | 2 | 3 | 4 | 5 | 6 | 7 | 8 | 9 | 10 | 11 | 12 | 13 | 14 | 15 |
| 0 | 0 | 0 | 0 | 0 | 0 | 0 | 0 | 0 | 0 | 0 | 0 | 0 | 0 | 0 | 0 | 0 |
| 1 | 1 | 1 | 1 | 1 | 1 | 1 | 1 | 1 | 1 | 1 | 1 | 1 | 1 | 1 | 1 | 1 |
| 2 | 2 | 2 | 2 | 2 | 2 | 2 | 2 | 2 | 2 | 2 | 2 | 2 | 2 | 2 | 2 | 2 |
| 3 | 3 | 3 | 3 | 3 | 3 | 3 | 3 | 3 | 3 | 3 | 3 | 3 | 3 | 3 | 3 | 3 |
| 4 | 4 | 4 | 4 | 4 | 4 | 4 | 4 | 4 | 4 | 4 | 4 | 4 | 4 | 4 | 4 | 4 |
| 5 | 5 | 5 | 5 | 5 | 5 | 5 | 5 | 5 | 5 | 5 | 5 | 5 | 5 | 5 | 5 | 5 |
| 6 | 6 | 6 | 6 | 6 | 6 | 6 | 6 | 6 | 6 | 6 | 6 | 6 | 6 | 6 | 6 | 6 |
| 7 | 7 | 7 | 7 | 7 | 7 | 7 | 7 | 7 | 7 | 7 | 7 | 7 | 7 | 7 | 7 | 7 |

FIG. 16

| disparity | r[6:3] | | | | | | | | | | | | | | | |
|---|---|---|---|---|---|---|---|---|---|---|---|---|---|---|---|---|
| r[2:0] | 0 | 1 | 2 | 3 | 4 | 5 | 6 | 7 | 8 | 9 | 10 | 11 | 12 | 13 | 14 | 15 |
| 0 | 4 | 6 | 6 | 8 | 6 | 8 | 8 | 10 | 6 | 8 | 8 | 10 | 8 | 10 | 10 | 12 |
| 1 | 2 | 0 | 4 | 2 | 4 | 2 | 6 | 4 | 4 | 2 | 6 | 4 | 6 | 4 | 8 | 6 |
| 2 | 2 | 4 | 0 | 2 | 4 | 6 | 2 | 4 | 4 | 6 | 2 | 4 | 6 | 8 | 4 | 6 |
| 3 | 0 | -2 | -2 | -4 | 2 | 0 | 0 | -2 | 2 | 0 | 0 | -2 | 4 | 2 | 2 | 0 |
| 4 | 2 | 4 | 4 | 6 | 0 | 2 | 2 | 4 | 4 | 6 | 6 | 8 | 2 | 4 | 4 | 6 |
| 5 | 0 | -2 | 2 | 0 | -2 | -4 | 0 | -2 | 2 | 0 | 4 | 2 | 0 | -2 | 2 | 0 |
| 6 | 0 | 2 | -2 | 0 | -2 | 0 | -4 | -2 | 2 | 4 | 0 | 2 | 0 | 2 | -2 | 0 |
| 7 | -2 | -4 | -4 | -6 | -4 | -6 | -6 | -8 | 0 | -2 | -2 | -4 | -2 | -4 | -4 | -6 |

FIG. 17

| Q[3:0] | r[6:3] | | | | | | | | | | | | | | | |
|---|---|---|---|---|---|---|---|---|---|---|---|---|---|---|---|---|
| r[2:0] | 0 | 1 | 2 | 3 | 4 | 5 | 6 | 7 | 8 | 9 | 10 | 11 | 12 | 13 | 14 | 15 |
| 0 | 0 | 0 | 0 | 0 | 0 | 0 | 0 | 0 | 0 | 0 | 0 | 0 | 0 | 0 | 0 | 0 |
| 1 | 1 | 1 | 1 | 1 | 1 | 1 | 1 | 1 | 1 | 1 | 1 | 1 | 1 | 1 | 1 | 1 |
| 2 | 2 | 2 | 2 | 2 | 2 | 2 | 2 | 2 | 2 | 2 | 2 | 2 | 2 | 2 | 2 | 2 |
| 3 | 3 | 12 | 12 | 12 | 3 | 3 | 3 | 12 | 3 | 3 | 3 | 12 | 3 | 3 | 3 | 3 |
| 4 | 4 | 4 | 4 | 4 | 4 | 4 | 4 | 4 | 4 | 4 | 4 | 4 | 4 | 4 | 4 | 4 |
| 5 | 5 | 10 | 5 | 5 | 10 | 10 | 5 | 10 | 5 | 5 | 5 | 5 | 5 | 10 | 5 | 5 |
| 6 | 6 | 6 | 9 | 6 | 9 | 6 | 9 | 9 | 6 | 6 | 6 | 6 | 6 | 6 | 9 | 6 |
| 7 | 8 | 8 | 8 | 8 | 8 | 8 | 8 | 8 | 8 | 8 | 8 | 8 | 8 | 8 | 8 | 8 |

FIG. 18

| disparity | r[6:3] | | | | | | | | | | | | | | | |
|---|---|---|---|---|---|---|---|---|---|---|---|---|---|---|---|---|
| r[2:0] | 0 | 1 | 2 | 3 | 4 | 5 | 6 | 7 | 8 | 9 | 10 | 11 | 12 | 13 | 14 | 15 |
| 0 | 4 | 6 | 6 | 8 | 6 | 8 | 8 | 10 | 6 | 8 | 8 | 10 | 8 | 10 | 10 | 12 |
| 1 | 2 | 0 | 4 | 2 | 4 | 2 | 6 | 4 | 4 | 2 | 6 | 4 | 6 | 4 | 8 | 6 |
| 2 | 2 | 4 | 0 | 2 | 4 | 6 | 2 | 4 | 4 | 6 | 2 | 4 | 6 | 8 | 4 | 6 |
| 3 | 0 | 2 | 2 | 4 | 2 | 0 | 0 | 2 | 2 | 0 | 0 | 2 | 4 | 2 | 2 | 0 |
| 4 | 2 | 4 | 4 | 6 | 0 | 2 | 2 | 4 | 4 | 6 | 6 | 8 | 2 | 4 | 4 | 6 |
| 5 | 0 | 2 | 2 | 0 | 2 | 4 | 0 | 2 | 2 | 0 | 4 | 2 | 0 | 2 | 2 | 0 |
| 6 | 0 | 2 | 2 | 0 | 2 | 0 | 4 | 2 | 2 | 4 | 0 | 2 | 0 | 2 | 2 | 0 |
| 7 | 2 | 4 | 4 | 6 | 4 | 6 | 6 | 8 | 0 | 2 | 2 | 4 | 2 | 4 | 4 | 6 |

FIG. 19

| Q[3:0] | r[6:3] | | | | | | | | | | | | | | | |
|---|---|---|---|---|---|---|---|---|---|---|---|---|---|---|---|---|
| r[2:0] | 0 | 1 | 2 | 3 | 4 | 5 | 6 | 7 | 8 | 9 | 10 | 11 | 12 | 13 | 14 | 15 |
| 0 | 0 | 0 | 0 | 0 | 0 | 0 | 0 | 0 | 0 | 0 | 0 | 0 | 0 | 0 | 0 | 0 |
| 1 | 1 | 1 | 1 | 1 | 1 | 1 | 1 | 1 | 1 | 1 | 1 | 1 | 1 | 1 | 1 | 1 |
| 2 | 2 | 2 | 2 | 2 | 2 | 2 | 2 | 2 | 2 | 2 | 2 | 2 | 2 | 2 | 2 | 2 |
| 3 | 12 | 12 | 12 | 12 | 3 | 12 | 12 | 12 | 3 | 3 | 3 | 12 | 3 | 3 | 3 | 3 |
| 4 | 4 | 4 | 4 | 4 | 4 | 4 | 4 | 4 | 4 | 4 | 4 | 4 | 4 | 4 | 4 | 4 |
| 5 | 10 | 10 | 5 | 5 | 10 | 10 | 10 | 10 | 5 | 5 | 5 | 5 | 10 | 10 | 5 | 5 |
| 6 | 6 | 6 | 9 | 9 | 9 | 9 | 9 | 9 | 6 | 6 | 6 | 6 | 6 | 6 | 9 | 9 |
| 7 | 8 | 8 | 8 | 8 | 8 | 8 | 8 | 8 | 8 | 8 | 8 | 8 | 8 | 8 | 8 | 8 |

FIG. 20

| Q[3:0] | r[6:3] | | | | | | | | | | | | | | | |
|---|---|---|---|---|---|---|---|---|---|---|---|---|---|---|---|---|
| r[2:0] | 0 | 1 | 2 | 3 | 4 | 5 | 6 | 7 | 8 | 9 | 10 | 11 | 12 | 13 | 14 | 15 |
| 0 | 15 | 15 | 15 | 15 | 15 | 15 | 15 | 15 | 15 | 15 | 15 | 15 | 15 | 15 | 15 | 15 |
| 1 | 14 | 14 | 14 | 14 | 14 | 14 | 14 | 14 | 14 | 14 | 14 | 14 | 14 | 14 | 14 | 14 |
| 2 | 13 | 13 | 13 | 13 | 13 | 13 | 13 | 13 | 13 | 13 | 13 | 13 | 13 | 13 | 13 | 13 |
| 3 | 3 | 3 | 3 | 3 | 12 | 3 | 3 | 3 | 12 | 12 | 12 | 3 | 12 | 12 | 12 | 12 |
| 4 | 11 | 11 | 11 | 11 | 11 | 11 | 11 | 11 | 11 | 11 | 11 | 11 | 11 | 11 | 11 | 11 |
| 5 | 5 | 5 | 10 | 10 | 5 | 5 | 5 | 5 | 10 | 10 | 10 | 10 | 5 | 5 | 10 | 10 |
| 6 | 9 | 9 | 6 | 6 | 6 | 6 | 6 | 6 | 9 | 9 | 9 | 9 | 9 | 9 | 6 | 6 |
| 7 | 7 | 7 | 7 | 7 | 7 | 7 | 7 | 7 | 7 | 7 | 7 | 7 | 7 | 7 | 7 | 7 |

| | r[6:3] => L[3:0] | | | | r[6:0] => Q[3:0] | | | | NS = P | | | | NS = N | | | |
|---|---|---|---|---|---|---|---|---|---|---|---|---|---|---|---|---|
| r[6:0] | L[3] | L[2] | L[1] | L[0] | Q[3] | Q[2] | Q[1] | Q[0] | S[3] | S[2] | S[1] | S[0] | S[3] | S[2] | S[1] | S[0] |
| 0 | 1 | 1 | 1 | 1 | 1 | 1 | 1 | 1 | 1 | 1 | 1 | 1 | -1 | -1 | -1 | -1 |
| 1 | 1 | 1 | 1 | 1 | 1 | 1 | 1 | -1 | 1 | 1 | 1 | -1 | -1 | -1 | -1 | 1 |
| 2 | 1 | 1 | 1 | 1 | 1 | 1 | -1 | 1 | 1 | 1 | -1 | 1 | -1 | -1 | 1 | -1 |
| 3 | 1 | 1 | 1 | 1 | -1 | -1 | 1 | 1 | -1 | -1 | 1 | 1 | 1 | 1 | -1 | -1 |
| 4 | 1 | 1 | 1 | 1 | 1 | -1 | 1 | 1 | 1 | -1 | 1 | 1 | -1 | 1 | -1 | -1 |
| 5 | 1 | 1 | 1 | 1 | -1 | 1 | -1 | 1 | -1 | 1 | -1 | 1 | 1 | -1 | 1 | -1 |
| 6 | 1 | 1 | 1 | 1 | 1 | -1 | -1 | 1 | 1 | -1 | -1 | 1 | -1 | 1 | 1 | -1 |
| 7 | 1 | 1 | 1 | 1 | -1 | 1 | 1 | 1 | -1 | 1 | 1 | 1 | 1 | -1 | -1 | -1 |
| 8 | 1 | 1 | 1 | 3 | 1 | 1 | 1 | 1 | 1 | 1 | 1 | 3 | -1 | -1 | -1 | -3 |
| 9 | 1 | 1 | 1 | 3 | 1 | 1 | 1 | -1 | 1 | 1 | 1 | -3 | -1 | -1 | -1 | 3 |
| 10 | 1 | 1 | 1 | 3 | 1 | 1 | -1 | 1 | 1 | 1 | -1 | 3 | -1 | -1 | 1 | -3 |
| 11 | 1 | 1 | 1 | 3 | -1 | -1 | 1 | 1 | -1 | -1 | 1 | 3 | 1 | 1 | -1 | -3 |
| 12 | 1 | 1 | 1 | 3 | 1 | -1 | 1 | 1 | 1 | -1 | 1 | 3 | -1 | 1 | -1 | -3 |
| 13 | 1 | 1 | 1 | 3 | -1 | 1 | -1 | 1 | -1 | 1 | -1 | 3 | 1 | -1 | 1 | -3 |
| 14 | 1 | 1 | 1 | 3 | 1 | -1 | -1 | 1 | 1 | -1 | -1 | 3 | -1 | 1 | 1 | -3 |
| 15 | 1 | 1 | 1 | 3 | -1 | 1 | 1 | 1 | -1 | 1 | 1 | 3 | 1 | -1 | -1 | -3 |
| 16 | 1 | 1 | 3 | 1 | 1 | 1 | 1 | 1 | 1 | 1 | 3 | 1 | -1 | -1 | -3 | -1 |
| 17 | 1 | 1 | 3 | 1 | 1 | 1 | 1 | -1 | 1 | 1 | 3 | -1 | -1 | -1 | -3 | 1 |
| 18 | 1 | 1 | 3 | 1 | 1 | 1 | -1 | 1 | 1 | 1 | -3 | 1 | -1 | -1 | 3 | -1 |
| 19 | 1 | 1 | 3 | 1 | -1 | -1 | 1 | 1 | -1 | -1 | 3 | 1 | 1 | 1 | -3 | -1 |
| 20 | 1 | 1 | 3 | 1 | 1 | -1 | 1 | 1 | 1 | -1 | 3 | 1 | -1 | 1 | -3 | -1 |
| 21 | 1 | 1 | 3 | 1 | 1 | -1 | 1 | -1 | 1 | -1 | 3 | -1 | -1 | 1 | -3 | 1 |
| 22 | 1 | 1 | 3 | 1 | -1 | 1 | 1 | -1 | -1 | 1 | 3 | -1 | 1 | -1 | -3 | 1 |
| 23 | 1 | 1 | 3 | 1 | -1 | 1 | 1 | 1 | -1 | 1 | 3 | 1 | 1 | -1 | -3 | -1 |
| 24 | 1 | 1 | 3 | 3 | 1 | 1 | 1 | 1 | 1 | 1 | 3 | 3 | -1 | -1 | -3 | -3 |
| 25 | 1 | 1 | 3 | 3 | 1 | 1 | 1 | -1 | 1 | 1 | 3 | -3 | -1 | -1 | -3 | 3 |
| 26 | 1 | 1 | 3 | 3 | 1 | 1 | -1 | 1 | 1 | 1 | -3 | 3 | -1 | -1 | 3 | -3 |
| 27 | 1 | 1 | 3 | 3 | -1 | -1 | 1 | 1 | -1 | -1 | 3 | 3 | 1 | 1 | -3 | -3 |
| 28 | 1 | 1 | 3 | 3 | 1 | -1 | 1 | 1 | 1 | -1 | 3 | 3 | -1 | 1 | -3 | -3 |
| 29 | 1 | 1 | 3 | 3 | 1 | -1 | 1 | -1 | 1 | -1 | 3 | -3 | -1 | 1 | -3 | 3 |
| 30 | 1 | 1 | 3 | 3 | -1 | 1 | 1 | -1 | -1 | 1 | 3 | -3 | 1 | -1 | -3 | 3 |
| 31 | 1 | 1 | 3 | 3 | -1 | 1 | 1 | 1 | -1 | 1 | 3 | 3 | 1 | -1 | -3 | -3 |
| 32 | 1 | 3 | 1 | 1 | 1 | 1 | 1 | 1 | 1 | 3 | 1 | 1 | -1 | -3 | -1 | -1 |
| 33 | 1 | 3 | 1 | 1 | 1 | 1 | 1 | -1 | 1 | 3 | 1 | -1 | -1 | -3 | -1 | 1 |

FIG. 21A

| | r[6:3] => L[3:0] | | | | r[6:0] => Q[3:0] | | | | NS = P | | | | NS = N | | | |
|---|---|---|---|---|---|---|---|---|---|---|---|---|---|---|---|---|
| r[6:0] | L[3] | L[2] | L[1] | L[0] | Q[3] | Q[2] | Q[1] | Q[0] | S[3] | S[2] | S[1] | S[0] | S[3] | S[2] | S[1] | S[0] |
| 33 | 1 | 3 | 1 | 1 | 1 | 1 | 1 | -1 | 1 | 3 | 1 | -1 | -1 | -3 | -1 | 1 |
| 34 | 1 | 3 | 1 | 1 | 1 | 1 | -1 | 1 | 1 | 3 | -1 | 1 | -1 | -3 | 1 | -1 |
| 35 | 1 | 3 | 1 | 1 | 1 | 1 | -1 | -1 | 1 | 3 | -1 | -1 | -1 | -3 | 1 | 1 |
| 36 | 1 | 3 | 1 | 1 | 1 | -1 | 1 | 1 | 1 | -3 | 1 | 1 | -1 | 3 | -1 | -1 |
| 37 | 1 | 3 | 1 | 1 | -1 | 1 | -1 | 1 | -1 | 3 | -1 | 1 | 1 | -3 | 1 | -1 |
| 38 | 1 | 3 | 1 | 1 | -1 | 1 | 1 | -1 | -1 | 3 | 1 | -1 | 1 | -3 | -1 | 1 |
| 39 | 1 | 3 | 1 | 1 | -1 | 1 | 1 | 1 | -1 | 3 | 1 | 1 | 1 | -3 | -1 | -1 |
| 40 | 1 | 3 | 1 | 3 | 1 | 1 | 1 | 1 | 1 | 3 | 1 | 3 | -1 | -3 | -1 | -3 |
| 41 | 1 | 3 | 1 | 3 | 1 | 1 | 1 | -1 | 1 | 3 | 1 | -3 | -1 | -3 | -1 | 3 |
| 42 | 1 | 3 | 1 | 3 | 1 | 1 | -1 | 1 | 1 | 3 | -1 | 3 | -1 | -3 | 1 | -3 |
| 43 | 1 | 3 | 1 | 3 | -1 | -1 | 1 | 1 | -1 | -3 | 1 | 3 | 1 | 3 | -1 | -3 |
| 44 | 1 | 3 | 1 | 3 | 1 | -1 | 1 | 1 | 1 | -3 | 1 | 3 | -1 | 3 | -1 | -3 |
| 45 | 1 | 3 | 1 | 3 | -1 | 1 | -1 | 1 | -1 | 3 | -1 | 3 | 1 | -3 | 1 | -3 |
| 46 | 1 | 3 | 1 | 3 | -1 | 1 | 1 | -1 | -1 | 3 | 1 | -3 | 1 | -3 | -1 | 3 |
| 47 | 1 | 3 | 1 | 3 | -1 | 1 | 1 | 1 | -1 | 3 | 1 | 3 | 1 | -3 | -1 | -3 |
| 48 | 1 | 3 | 3 | 1 | 1 | 1 | 1 | 1 | 1 | 3 | 3 | 1 | -1 | -3 | -3 | -1 |
| 49 | 1 | 3 | 3 | 1 | 1 | 1 | 1 | -1 | 1 | 3 | 3 | -1 | -1 | -3 | -3 | 1 |
| 50 | 1 | 3 | 3 | 1 | 1 | 1 | -1 | 1 | 1 | 3 | -3 | 1 | -1 | -3 | 3 | -1 |
| 51 | 1 | 3 | 3 | 1 | -1 | -1 | 1 | 1 | -1 | -3 | 3 | 1 | 1 | 3 | -3 | -1 |
| 52 | 1 | 3 | 3 | 1 | 1 | -1 | 1 | 1 | 1 | -3 | 3 | 1 | -1 | 3 | -3 | -1 |
| 53 | 1 | 3 | 3 | 1 | -1 | 1 | -1 | 1 | -1 | 3 | -3 | 1 | 1 | -3 | 3 | -1 |
| 54 | 1 | 3 | 3 | 1 | -1 | 1 | 1 | -1 | -1 | 3 | 3 | -1 | 1 | -3 | -3 | 1 |
| 55 | 1 | 3 | 3 | 1 | -1 | 1 | 1 | 1 | -1 | 3 | 3 | 1 | 1 | -3 | -3 | -1 |
| 56 | 1 | 3 | 3 | 3 | 1 | 1 | 1 | 1 | 1 | 3 | 3 | 3 | -1 | -3 | -3 | -3 |
| 57 | 1 | 3 | 3 | 3 | 1 | 1 | 1 | -1 | 1 | 3 | 3 | -3 | -1 | -3 | -3 | 3 |
| 58 | 1 | 3 | 3 | 3 | 1 | 1 | -1 | 1 | 1 | 3 | -3 | 3 | -1 | -3 | 3 | -3 |
| 59 | 1 | 3 | 3 | 3 | -1 | -1 | 1 | 1 | -1 | -3 | 3 | 3 | 1 | 3 | -3 | -3 |
| 60 | 1 | 3 | 3 | 3 | 1 | -1 | 1 | 1 | 1 | -3 | 3 | 3 | -1 | 3 | -3 | -3 |
| 61 | 1 | 3 | 3 | 3 | -1 | 1 | -1 | 1 | -1 | 3 | -3 | 3 | 1 | -3 | 3 | -3 |

FIG. 21B

| | r[6:3] => L[3:0] | | | | r[6:0] => Q[3:0] | | | | NS = P | | | | NS = N | | | |
|---|---|---|---|---|---|---|---|---|---|---|---|---|---|---|---|---|
| r[6:0] | L[3] | L[2] | L[1] | L[0] | Q[3] | Q[2] | Q[1] | Q[0] | S[3] | S[2] | S[1] | S[0] | S[3] | S[2] | S[1] | S[0] |
| 64 | 3 | 1 | 1 | 1 | 1 | 1 | 1 | 1 | 3 | 1 | 1 | 1 | -3 | -1 | -1 | -1 |
| 65 | 3 | 1 | 1 | 1 | 1 | 1 | 1 | -1 | 3 | 1 | 1 | -1 | -3 | -1 | -1 | 1 |
| 66 | 3 | 1 | 1 | 1 | 1 | 1 | -1 | 1 | 3 | 1 | -1 | 1 | -3 | -1 | 1 | -1 |
| 67 | 3 | 1 | 1 | 1 | 1 | 1 | -1 | -1 | 3 | 1 | -1 | -1 | -3 | -1 | 1 | 1 |
| 68 | 3 | 1 | 1 | 1 | 1 | -1 | 1 | 1 | 3 | -1 | 1 | 1 | -3 | 1 | -1 | -1 |
| 69 | 3 | 1 | 1 | 1 | 1 | -1 | 1 | -1 | 3 | -1 | 1 | -1 | -3 | 1 | -1 | 1 |
| 70 | 3 | 1 | 1 | 1 | 1 | -1 | -1 | 1 | 3 | -1 | -1 | 1 | -3 | 1 | 1 | -1 |
| 71 | 3 | 1 | 1 | 1 | -1 | 1 | 1 | 1 | -3 | 1 | 1 | 1 | 3 | -1 | -1 | -1 |
| 72 | 3 | 1 | 1 | 3 | 1 | 1 | 1 | 1 | 3 | 1 | 1 | 3 | -3 | -1 | -1 | -3 |
| 73 | 3 | 1 | 1 | 3 | 1 | 1 | 1 | -1 | 3 | 1 | 1 | -3 | -3 | -1 | -1 | 3 |
| 74 | 3 | 1 | 1 | 3 | 1 | 1 | -1 | 1 | 3 | 1 | -1 | 3 | -3 | -1 | 1 | -3 |
| 75 | 3 | 1 | 1 | 3 | 1 | 1 | -1 | -1 | 3 | 1 | -1 | -3 | -3 | -1 | 1 | 3 |
| 76 | 3 | 1 | 1 | 3 | 1 | -1 | 1 | 1 | 3 | -1 | 1 | 3 | -3 | 1 | -1 | -3 |
| 77 | 3 | 1 | 1 | 3 | 1 | -1 | 1 | -1 | 3 | -1 | 1 | -3 | -3 | 1 | -1 | 3 |
| 78 | 3 | 1 | 1 | 3 | 1 | -1 | -1 | 1 | 3 | -1 | -1 | 3 | -3 | 1 | 1 | -3 |
| 79 | 3 | 1 | 1 | 3 | -1 | 1 | 1 | 1 | -3 | 1 | 1 | 3 | 3 | -1 | -1 | -3 |
| 80 | 3 | 1 | 3 | 1 | 1 | 1 | 1 | 1 | 3 | 1 | 3 | 1 | -3 | -1 | -3 | -1 |
| 81 | 3 | 1 | 3 | 1 | 1 | 1 | 1 | -1 | 3 | 1 | 3 | -1 | -3 | -1 | -3 | 1 |
| 82 | 3 | 1 | 3 | 1 | 1 | 1 | -1 | 1 | 3 | 1 | -3 | 1 | -3 | -1 | 3 | -1 |
| 83 | 3 | 1 | 3 | 1 | 1 | 1 | -1 | -1 | 3 | 1 | -3 | -1 | -3 | -1 | 3 | 1 |
| 84 | 3 | 1 | 3 | 1 | 1 | -1 | 1 | 1 | 3 | -1 | 3 | 1 | -3 | 1 | -3 | -1 |
| 85 | 3 | 1 | 3 | 1 | 1 | -1 | 1 | -1 | 3 | -1 | 3 | -1 | -3 | 1 | -3 | 1 |
| 86 | 3 | 1 | 3 | 1 | 1 | -1 | -1 | 1 | 3 | -1 | -3 | 1 | -3 | 1 | 3 | -1 |
| 87 | 3 | 1 | 3 | 1 | -1 | 1 | 1 | 1 | -3 | 1 | 3 | 1 | 3 | -1 | -3 | -1 |
| 88 | 3 | 1 | 3 | 3 | 1 | 1 | 1 | 1 | 3 | 1 | 3 | 3 | -3 | -1 | -3 | -3 |
| 89 | 3 | 1 | 3 | 3 | 1 | 1 | 1 | -1 | 3 | 1 | 3 | -3 | -3 | -1 | -3 | 3 |
| 90 | 3 | 1 | 3 | 3 | 1 | 1 | -1 | 1 | 3 | 1 | -3 | 3 | -3 | -1 | 3 | -3 |

FIG. 21C

| | r[6:3] => L[3:0] | | | | r[6:0] => Q[3:0] | | | | NS = P | | | | NS = N | | | |
|---|---|---|---|---|---|---|---|---|---|---|---|---|---|---|---|---|
| r[6:0] | L[3] | L[2] | L[1] | L[0] | Q[3] | Q[2] | Q[1] | Q[0] | S[3] | S[2] | S[1] | S[0] | S[3] | S[2] | S[1] | S[0] |
| 91 | 3 | 1 | 3 | 3 | -1 | -1 | 1 | 1 | -3 | -1 | 3 | 3 | 3 | 1 | -3 | -3 |
| 92 | 3 | 1 | 3 | 3 | 1 | -1 | 1 | 1 | 3 | -1 | 3 | 3 | -3 | 1 | -3 | -3 |
| 93 | 3 | 1 | 3 | 3 | 1 | -1 | 1 | -1 | 3 | -1 | 3 | -3 | -3 | 1 | -3 | 3 |
| 94 | 3 | 1 | 3 | 3 | 1 | -1 | -1 | 1 | 3 | -1 | -3 | 3 | -3 | 1 | 3 | -3 |
| 95 | 3 | 1 | 3 | 3 | -1 | 1 | 1 | 1 | -3 | 1 | 3 | 3 | 3 | -1 | -3 | -3 |
| 96 | 3 | 3 | 1 | 1 | 1 | 1 | 1 | 1 | 3 | 3 | 1 | 1 | -3 | -3 | -1 | -1 |
| 97 | 3 | 3 | 1 | 1 | 1 | 1 | 1 | -1 | 3 | 3 | 1 | -1 | -3 | -3 | -1 | 1 |
| 98 | 3 | 3 | 1 | 1 | 1 | 1 | -1 | 1 | 3 | 3 | -1 | 1 | -3 | -3 | 1 | -1 |
| 99 | 3 | 3 | 1 | 1 | 1 | 1 | -1 | -1 | 3 | 3 | -1 | -1 | -3 | -3 | 1 | 1 |
| 100 | 3 | 3 | 1 | 1 | 1 | -1 | 1 | 1 | 3 | -3 | 1 | 1 | -3 | 3 | -1 | -1 |
| 101 | 3 | 3 | 1 | 1 | -1 | 1 | -1 | 1 | -3 | 3 | -1 | 1 | 3 | -3 | 1 | -1 |
| 102 | 3 | 3 | 1 | 1 | 1 | -1 | -1 | 1 | 3 | -3 | -1 | 1 | -3 | 3 | 1 | -1 |
| 103 | 3 | 3 | 1 | 1 | -1 | 1 | 1 | 1 | -3 | 3 | 1 | 1 | 3 | -3 | -1 | -1 |
| 104 | 3 | 3 | 1 | 3 | 1 | 1 | 1 | 1 | 3 | 3 | 1 | 3 | -3 | -3 | -1 | -3 |
| 105 | 3 | 3 | 1 | 3 | 1 | 1 | 1 | -1 | 3 | 3 | 1 | -3 | -3 | -3 | -1 | 3 |
| 106 | 3 | 3 | 1 | 3 | 1 | 1 | -1 | 1 | 3 | 3 | -1 | 3 | -3 | -3 | 1 | -3 |
| 107 | 3 | 3 | 1 | 3 | 1 | 1 | -1 | -1 | 3 | 3 | -1 | -3 | -3 | -3 | 1 | 3 |
| 108 | 3 | 3 | 1 | 3 | 1 | -1 | 1 | 1 | 3 | -3 | 1 | 3 | -3 | 3 | -1 | -3 |
| 109 | 3 | 3 | 1 | 3 | -1 | 1 | -1 | 1 | -3 | 3 | -1 | 3 | 3 | -3 | 1 | -3 |
| 110 | 3 | 3 | 1 | 3 | 1 | -1 | -1 | 1 | 3 | -3 | -1 | 3 | -3 | 3 | 1 | -3 |
| 111 | 3 | 3 | 1 | 3 | -1 | 1 | 1 | 1 | -3 | 3 | 1 | 3 | 3 | -3 | -1 | -3 |
| 112 | 3 | 3 | 3 | 1 | 1 | 1 | 1 | 1 | 3 | 3 | 3 | 1 | -3 | -3 | -3 | -1 |
| 113 | 3 | 3 | 3 | 1 | 1 | 1 | 1 | -1 | 3 | 3 | 3 | -1 | -3 | -3 | -3 | 1 |
| 114 | 3 | 3 | 3 | 1 | 1 | 1 | -1 | 1 | 3 | 3 | -3 | 1 | -3 | -3 | 3 | -1 |
| 115 | 3 | 3 | 3 | 1 | 1 | 1 | -1 | -1 | 3 | 3 | -3 | -1 | -3 | -3 | 3 | 1 |
| 116 | 3 | 3 | 3 | 1 | 1 | -1 | 1 | 1 | 3 | -3 | 3 | 1 | -3 | 3 | -3 | -1 |
| 117 | 3 | 3 | 3 | 1 | 1 | -1 | 1 | -1 | 3 | -3 | 3 | -1 | -3 | 3 | -3 | 1 |
| 118 | 3 | 3 | 3 | 1 | -1 | 1 | 1 | -1 | -3 | 3 | 3 | -1 | 3 | -3 | -3 | 1 |
| 119 | 3 | 3 | 3 | 1 | -1 | 1 | 1 | 1 | -3 | 3 | 3 | 1 | 3 | -3 | -3 | -1 |
| 120 | 3 | 3 | 3 | 3 | 1 | 1 | 1 | 1 | 3 | 3 | 3 | 3 | -3 | -3 | -3 | -3 |
| 121 | 3 | 3 | 3 | 3 | 1 | 1 | 1 | -1 | 3 | 3 | 3 | -3 | -3 | -3 | -3 | 3 |
| 122 | 3 | 3 | 3 | 3 | 1 | 1 | -1 | 1 | 3 | 3 | -3 | 3 | -3 | -3 | 3 | -3 |
| 123 | 3 | 3 | 3 | 3 | 1 | 1 | -1 | -1 | 3 | 3 | -3 | -3 | -3 | -3 | 3 | 3 |
| 124 | 3 | 3 | 3 | 3 | 1 | -1 | 1 | 1 | 3 | -3 | 3 | 3 | -3 | 3 | -3 | -3 |
| 125 | 3 | 3 | 3 | 3 | 1 | -1 | 1 | -1 | 3 | -3 | 3 | -3 | -3 | 3 | -3 | 3 |

FIG. 21D

PULSE AMPLITUDE MODULATION WITH BOUNDED DISPARITY

CROSS-REFERENCE TO RELATED APPLICATIONS

This application claims the benefit of U.S. Provisional Application No. 63/620,374, filed on Jan. 12, 2024. The entire disclosure of the application referenced above is incorporated herein by reference.

FIELD

The present disclosure relates to communications devices, and more particularly to encoding and decoding of data transmitted between communications devices.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Communications devices can communicate with one another over a wired medium. In hazardous environments, there are intrinsic safety standards such as IEC TS 60079-47 that govern how much energy the communications devices can output over the line. These limitations help prevent safety hazards such as electronic sparks that can ignite flammable gases.

When power is delivered on the same line that is used for communications, cabling capacity is reduced. Attenuation on the line degrades the signal as it is transmitted over the line. This puts a limit on how far a signal can travel on a single line. The higher the symbol rate of the transmitted data, the shorter the reach.

SUMMARY

A communications device includes a mapping module configured to selectively map a plurality of n-bit signals to a plurality of (n+1)/2 symbols using one of a first set of symbols having one of a positive disparity and a zero disparity, and a second set of symbols each having one of a negative disparity and a zero disparity. An encoder is configured to a) select one of the first set of symbols and the second set of symbols as a next symbol set of the mapping module; b) encode a first one of the plurality of n-bit signals using the next symbol set of the mapping module; c) calculate a running disparity; d) if the running disparity is greater than zero, select the second set of symbols of the mapping module as the next symbol set; and e) if the running disparity is less than zero, select the first set of symbols of the mapping module as the next symbol set.

In other features, n is odd. The encoder is further configured to f) repeat (a) to (e) for other ones of the plurality of n-bit signals.

In other features, when the running disparity is equal to zero, the encoder is further configured to f) switch to the other one of the first set of symbols and the second set of symbols as the next symbol set of the mapping module. Each of the plurality of n-bit signals maps to a unique set of symbols in the first set of symbols and a unique set of symbols in the second set of symbols. Signals levels of corresponding ones of the symbols in the first set of symbols and the second set of symbols have the same magnitude but different polarity. The (n+1)/2 symbols are greater than two.

In other features, n equals 5 and the (n+1)/2 symbols equal 3. n equals 7 and the (n+1)/2 symbols equal 4.

In other features, a media independent interface is configured to output data blocks. An aggregator is configured to aggregate a plurality of the data blocks. An error encoder is configured to generate error encoded data. A scrambler is configured to scramble the error encoded data to generated scrambled data corresponding to the n-bit signals. The error encoder comprises a reed Solomon encoder. The data blocks comprise 64/65 data blocks and the error encoder outputs 7-bit symbols. The data blocks comprise 16/17 data blocks and the error encoder outputs 5-bit symbols.

A communications device includes a mapping module configured to map a plurality of u-bit signals into a plurality of (n+1)/2 symbols using one of a first set of symbols having one of a positive disparity and a zero disparity, and a second set of symbols each having one of a negative disparity and a zero disparity. The mapping module is configured to map a plurality of v-bit signals into the plurality of (n+1)/2 symbols using one of a third set of symbols having one of a positive disparity and a zero disparity, and a fourth set of symbols each having one of a negative disparity and a zero disparity. An encoder is configured to a) divide a plurality of n-bit signals into the plurality of u-bit signals and the plurality of v-bit signals, where n, u and v are integers; b) select one of the first set of symbols and the second set of symbols as a next symbol set of the mapping module; c) encode a first one of the plurality of u-bit signals using the next symbol set of the mapping module; d) calculate a running disparity; e) if the running disparity is greater than zero, select the second set of symbols of the mapping module as the next symbol set; f) if the running disparity is less than zero, select the first set of symbols of the mapping module as the next symbol set; g) select one of the third set of symbols and the fourth set of symbols as a next symbol set of the mapping module; h) encode a first one of the plurality of v-bit signals using the next symbol set of the mapping module; i) calculate a running disparity; j) if the running disparity is greater than zero, selecting the fourth set of symbols of the mapping module as the next symbol set; and k) if the running disparity is less than zero, selecting the third set of symbols of the mapping module as the next symbol set.

In other features, n is an even integer, and u and v are odd integers. The encoder is further configured to f) repeating (a) to (k) for other ones of the plurality of n-bit signals.

In other features, when the running disparity is equal to zero after f), the encoder is further configured to switch to the other one of the first set of symbols and the second set of symbols as the next symbol set of the mapping module; and when the running disparity is equal to zero after k), the encoder is further configured to switch to the other one of the third set of symbols and the fourth set of symbols as the next symbol set of the mapping module.

In other features, each of the plurality of u-bit signals maps to a unique set of symbols in the first set of symbols and a unique set of symbols in the second set of symbols. Each of the plurality of v-bit signals maps to a unique set of symbols in the third set of symbols and a unique set of symbols in the fourth set of symbols. Signals levels of corresponding ones of the symbols in the first set of symbols and the second set of symbols have the same magnitude but different polarity. Signals levels of corresponding ones of the symbols in the third set of symbols and the fourth set of symbols have the same magnitude but different polarity.

In other features, a media independent interface is configured to output data blocks. An aggregator is configured to aggregate a plurality of the data blocks. An error encoder is configured to generate error encoded data. A scrambler is configured to scramble the error encoded data to generated scrambled data corresponding to the n-bit signals. The error encoder comprises a reed Solomon encoder.

A method for operating a communications device includes a) selectively mapping a plurality of n-bit signals to a plurality of (n+1)/2 symbols using one of a first set of symbols having one of a positive disparity and a zero disparity and a second set of symbols each having one of a negative disparity and a zero disparity. The method includes b) selecting one of the first set of symbols and the second set of symbols as a next symbol set; c) encoding a first one of the plurality of n-bit signals using the next symbol set; d) calculating a running disparity; e) if the running disparity is greater than zero, selecting the second set of symbols as the next symbol set; and f) if the running disparity is less than zero, selecting the first set of symbols as the next symbol set.

In other features, n is odd. The method includes g) repeating (b) to (f) for other ones of the plurality of n-bit signals.

In other features, the method includes g) when the running disparity is equal to zero, switching to the other one of the first set of symbols and the second set of symbols as the next symbol set. Each of the plurality of n-bit signals maps to a unique set of symbols in the first set of symbols and a unique set of symbols in the second set of symbols. Signals levels of corresponding ones of the symbols in the first set of symbols and the second set of symbols have the same magnitude but different polarity. The (n+1)/2 symbols are greater than two. n equals 5 and the (n+1)/2 symbols equal 3. n equals 7 and the (n+1)/2 symbols equal 4.

A method for operating a communications device includes a) mapping a plurality of u-bit signals into a plurality of (n+1)/2 symbols using one of a first set of symbols having one of a positive disparity and a zero disparity, and a second set of symbols each having one of a negative disparity and a zero disparity; b) mapping a plurality of v-bit signals into the plurality of (n+1)/2 symbols using one of a third set of symbols having one of a positive disparity and a zero disparity, and a fourth set of symbols each having one of a negative disparity and a zero disparity; and c) dividing a plurality of n-bit signals into the plurality of u-bit signals and the plurality of v-bit signals, where n, u and v are integers; d) selecting one of the first set of symbols and the second set of symbols as a next symbol set; e) encoding a first one of the plurality of u-bit signals using the next symbol set; f) calculating a running disparity; g) if the running disparity is greater than zero, select the second set of symbols as the next symbol set; h) if the running disparity is less than zero, select the first set of symbols as the next symbol set; i) selecting one of the third set of symbols and the fourth set of symbols as a next symbol set; j) encoding a first one of the plurality of v-bit signals using the next symbol set; k) calculating a running disparity; l) if the running disparity is greater than zero, selecting the fourth set of symbols as the next symbol set; and m) if the running disparity is less than zero, selecting the third set of symbols as the next symbol set.

In other features, n is an even integer; and u and v are odd integers.

In other features, the method includes n) repeating (a) to (m) for other ones of the plurality of n-bit signals.

In other features, when the running disparity is equal to zero after h), the method includes switching to the other one of the first set of symbols and the second set of symbols as the next symbol set. When the running disparity is equal to zero after m), the method includes switching to the other one of the third set of symbols and the fourth set of symbols as the next symbol set.

In other features, each of the plurality of u-bit signals maps to a unique set of symbols in the first set of symbols and a unique set of symbols in the second set of symbols; and each of the plurality of v-bit signals maps to a unique set of symbols in the third set of symbols and a unique set of symbols in the fourth set of symbols.

In other features, signals levels of corresponding ones of the symbols in the first set of symbols and the second set of symbols have the same magnitude but different polarity; and signals levels of corresponding ones of the symbols in the third set of symbols and the fourth set of symbols have the same magnitude but different polarity. The (n+1)/2 symbols are greater than two.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF DRAWINGS

FIGS. 7 to 13 are tables related to 5 bit to 3 symbol encoding according to the present disclosure; and FIGS. 14 to 21D are tables related to 7 bit to 4 symbol encoding according to the present disclosure.

In the drawings, reference numbers may be reused to identify similar and/or identical elements.

DESCRIPTION

In hazardous environments, intrinsic safety standards (such as IEC TS 60079-47) limit how much energy can be output by communications devices over a line. These limitations help prevent safety hazards such as electronic sparks that can ignite flammable gases that may be present.

Sometimes power supply voltage for a remote communications device is delivered on the same line used for communications. This minimizes the cabling required in the system. There is attenuation on the line that degrades the signal as it is transmitted over the line. This puts a limit on how far a signal can travel on a single line. The higher the symbol rate of the transmitted data, the shorter the reach.

Traditionally, signals are delivered as 2-level pulse amplitude modulation (PAM2) signals. As more bandwidth is needed, multi-level data can be sent per symbol. For example, a 4-level signal (PAM4) can send about twice as much data as the 2-level signal if there is no noise in the system. For the same transmit power, 4-level signals are spaced closer together as compared to 2-level signals. In the presence of noise, the signal to noise level of the 4-level signals will degrade to the point where the signal is not recoverable at a distance that is shorter than the distance of the 2-level signals.

There is a tradeoff between running at higher symbol rates as compared to transmitting with more levels. For example, the data transmitted can be doubled by either running twice as fast at 2-level signals, or running at the same speed with 4-level signals. Depending on the characteristics of the line and the noise in the environment, one method can operate over longer distances than the other. Alternatively, for the same line length, one approach can achieve lower data error rates as compared to the other.

Another tradeoff that can be made is to use a percentage of the data to transmit parity symbols instead of data. The parity symbols are used to correct any errors at the receiver. Reed Solomon codes are a common error correction technique that can handle burst errors. Typically, the codes are specified as RS(n, k) GF($2^m$) including n m-bit symbols in the code word, k m-bit symbols for data, and n-k m-bit symbols for parity. The code can correct up to (n-k)/2 symbol errors. It does not matter how many bits in the m-bit symbol are corrupted. If a corrupted codeword is correctable, the entire symbol is corrected.

To control the energy that a communication device can send for intrinsic safety, a maximum allowed output voltage is specified. If power is supplied along with the signal, there is also a limit placed on the maximum power supply voltage since the transmitted voltage includes the transmitted signal voltage superimposed on the supply voltage.

Figure 1:
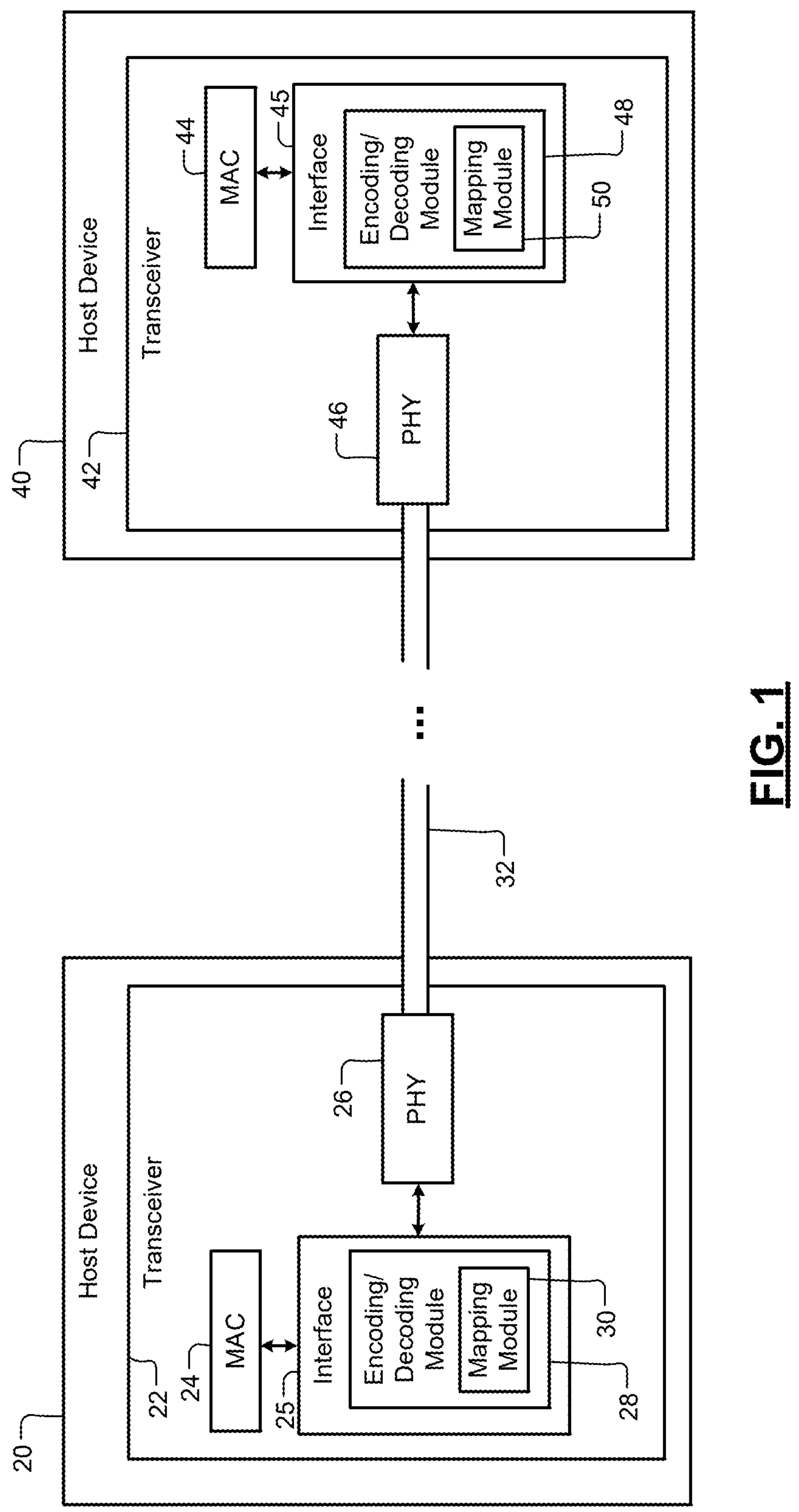
FIG. 1 is a functional block diagram of communications devices connected by a line and each including coding/decoding modules according to the present disclosure.

Referring now to FIG. 1, a first host device 20 includes a transceiver 22 including a media access control (MAC) device 24, an interface 25, and a physical layer (PHY) device 26. The interface 25 includes an encoding/decoding module 28 and a mapping module 30 configured to code signals transmitted by the first host device 20 on a medium 32 and to receive and decode signals received on the medium 32 from a second host device 40. The second host device 40 includes a transceiver 42 including a media access control (MAC) device 44, an interface 45, and a physical layer (PHY) device 46. The interface 45 includes an encoding/decoding module 48 and a mapping module 50 configured to code signals transmitted by the second host device 40 on the medium 32 and to receive and decode signals received on the medium 32 from the first host device 20.

Figures 2A, 2B:
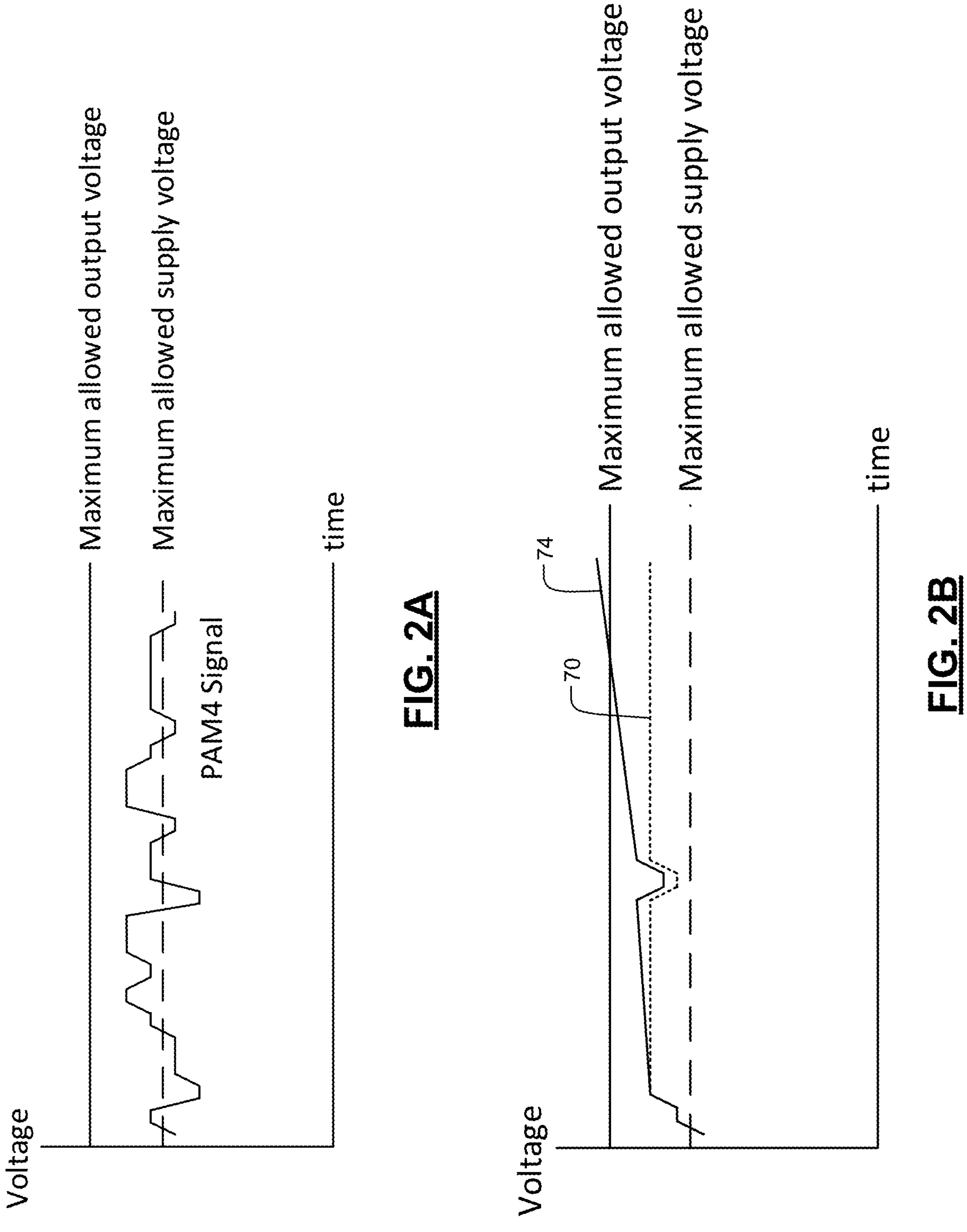
FIGS. 2A and 2B illustrate a transmitted signal (including a signal voltage and power supply voltage) that is DC balanced and that is not DC balanced, respectively.

Referring now to FIGS. 2A and 2B, examples of transmitted signals are shown. In FIG. 2A, a transmitted signal includes the signal voltage superimposed on a maximum allowed supply voltage. In this example, the transmitted signal remains below a maximum allowed output voltage. In FIG. 2B, if the transmitted signal is not DC balanced, charge accumulates over time. A dotted line 70 corresponds to a desired transmitted signal level. Due to imbalance, the transmitted signal level may accumulate enough charge to exceed the maximum allowed output voltage as shown at 74.

For a 2-level signal PAM2, there are DC balanced codes such as Manchester coding or 8 bit/10 bit coding where runs of +1 and −1 symbols are limited. Theses codes have a bounded disparity property. Regardless of the underlying data being sent, the imbalance is limited to a short, bounded duration. Since no significant charge can accumulate over time, these codes do not create an unsafe condition.

For a 4-level signal PAM4, there are DC balanced codes that reduce the probability of having long unbalanced runs. These codes do not eliminate imbalance completely. For example, 8 bit/10 bit coding can be used and the resulting 10 bits form five PAM4 symbols using two adjacent bits to form the symbol, (i.e., 00=+1, 01=+⅓, 10=−⅓, 11=−1). For example, the 10-bit code D21.5=1010101010 and D10.2=0101010101 will have 5 identical symbols when converted to PAM4. If the D21.5 code persists, it can create unbalanced conditions on the line.

The present disclosure relates to encoders/decoders configured to generate codes (e.g., a PAM4 code) that have bounded disparity regardless of the underlying data that is being sent. In some examples, the encoders/decoders according to the present disclosure construct a n-bit to (n+1)/2 symbol PAM4 mapping when n is odd or even.

When n is Odd

The n-bit binary input has $2^n$ different input codes (referred to as the set R). The (n+1)/2 symbols have $2^{n+1}$ different codes with each symbol made up of +1, +⅓, −⅓, −1 (that is the 2n+1 permutations of +1, +⅓, −⅓, −1). To simplify the notation, the symbol numbers are scaled (e.g., multiplied by 3) to avoid writing fractions to represent the 4-levels of PAM4 signal. (i.e., +3, +1, −1, −3).

The disparity of a particular code is defined by the sum of its symbols. For example, a 7-bit, 4-symbol code of {+3, +3, +3, +3} has a disparity of +12 and {+3, −1, −1, −1} has a disparity of 0. The set of $2^{n+1}$ codes can be separated into 2 sets of $2^n$ codes. Any code in one set has a matching code in the other set where all of the numbers have opposite signs but the same magnitude (i.e., for 5-bit, 3-symbol {+3, −1, −1} in one set has a matching code {−3, +1, +1} in the other set).

A positive set (referred to as set P) includes all codes having a positive disparity. A negative set (referred to as set N) includes all codes having a negative disparity. Codes with 0 disparity can arbitrarily be placed in either the N set or the P set as long as the matching code is in the other set. Each of the $2^n$ codes in the input set R is mapped to a unique code in the set P or its matching pair in the set N.

Figure 3A:
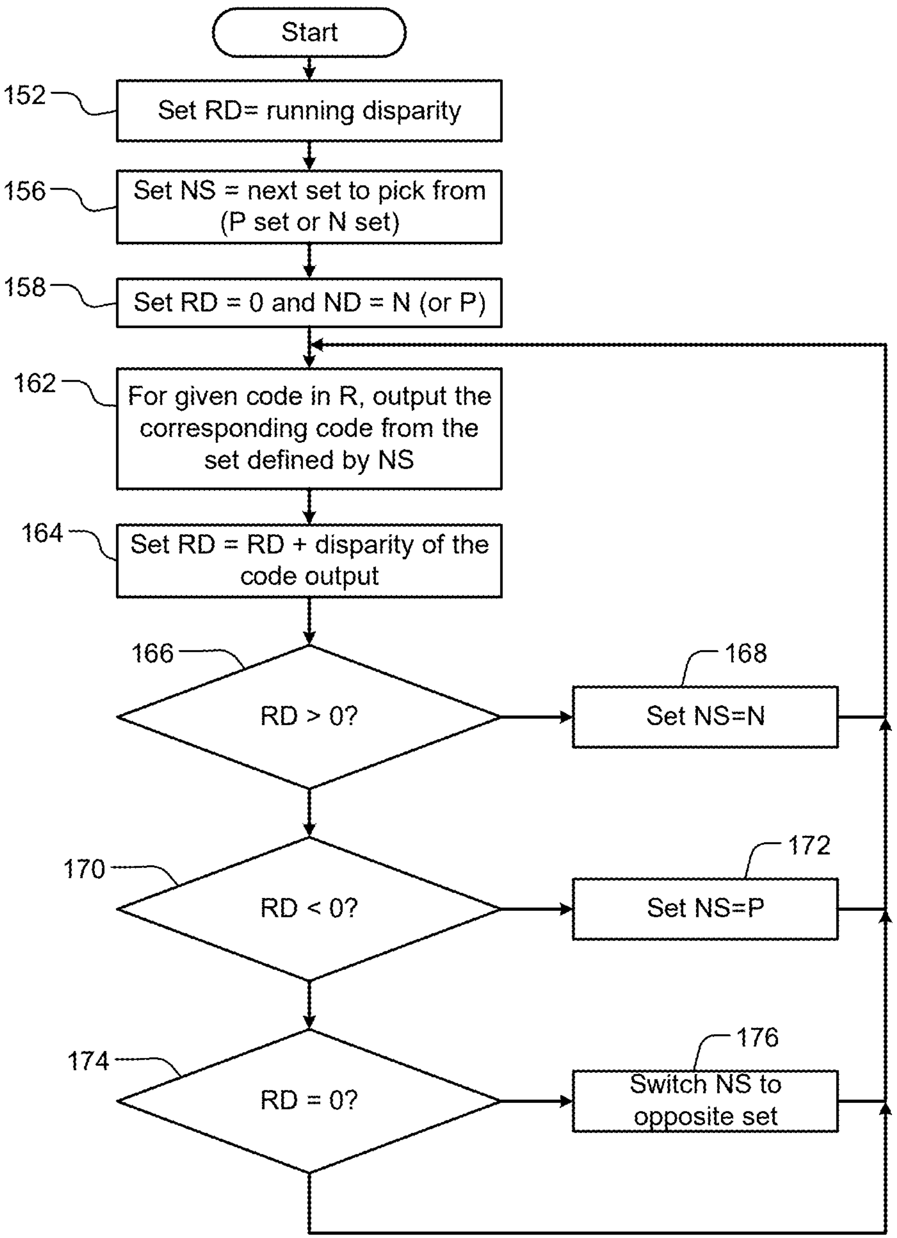
FIGS. 3A and 3B are flowcharts of methods for encoding input signals including an odd number of bits to improve DC balance by bounding disparity according to the present disclosure.
Figure 3B:
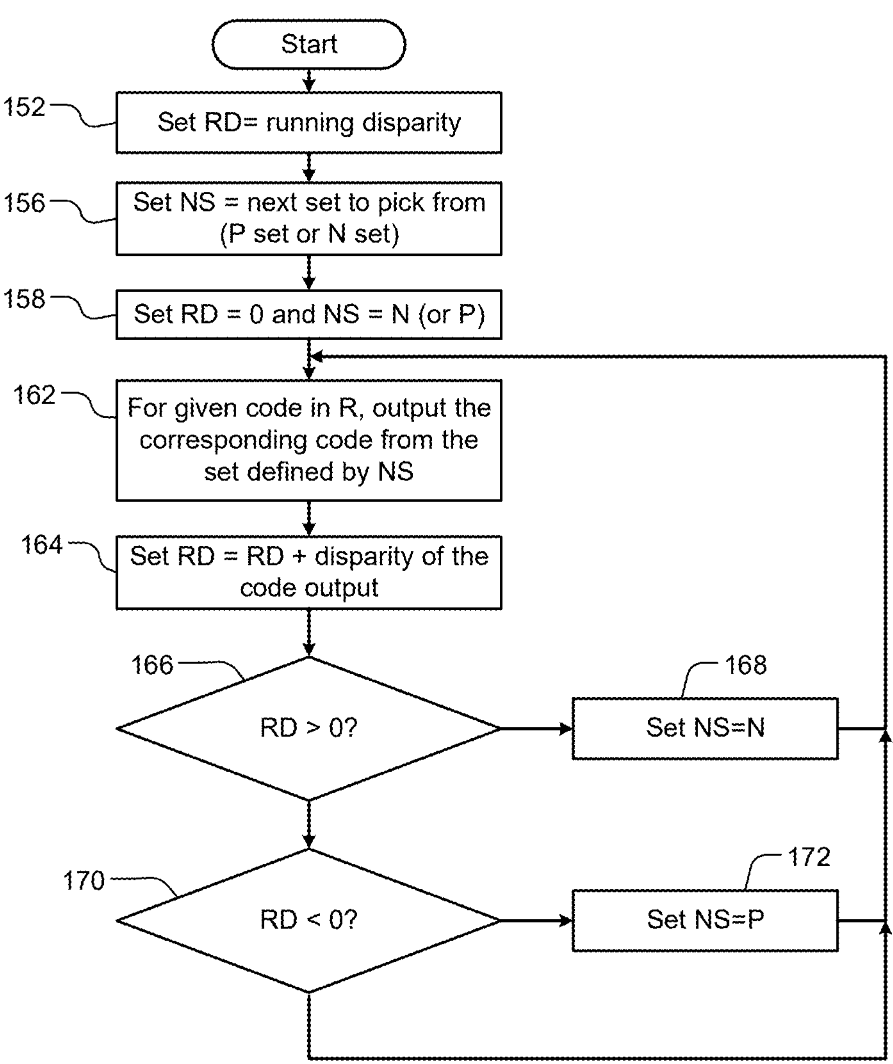

Referring now to FIGS. 3A and 3B, a sequence of input data from the input set R is mapped into a sequence of PAM 4 symbols from the P set or the N set. In FIG. 3A, the variables are defined at 152 and 156. RD is set equal to running disparity and NS is defined as the next set to pick from (either N for the N set or P for the P set, respectively).

At 158, RD is set equal to 0 and NS is set equal to N (NS can also be initialized to P). At 162, for the given code in R, the corresponding code from the set specified by NS is output. At 164, RD is set equal to RD+disparity of the code output. At 166, the method determines whether RD is positive. If 166 is true, then NS is set equal to N at 168 and the method returns to 162. If 166 is false, the method determines whether RD is negative at 170. If 170 is true, then NS is set equal to P at 172 and the method returns to 162. If 170 is false, the method determines whether RD=0 at 174. If 174 is true, the method switches NS to the opposite set at 176 and the method returns to 162. In FIG. 3B, the method can also not switch NS when RD=0.

Encoding and decoding using this approach bounds the running disparity to +/−3(n+1)/2 at the point when RD is computed every (n+1)/2 symbols. Note that in between RD computation, the disparity may get slightly larger. In other words, {+3, +3, +3}, {+3, −3, −1}. Assuming the initial RD=0, the next computed RD is +9 and then +8. The RD after the 4th symbol is +12 which momentarily larger than +9 but is still bounded.

When n is Even

An even number can be expressed as a sum of 2 odd numbers. To create a bounded disparity PAM4 code when n is even, 2 odd mappings (as described above) are combined. This creates a n-bit to n/2+1 symbol code. For example, n=8 can be constructed with a n=5 and n=3 code. N5 and P5 are positive and negative sets from the 5-bit to 3 symbol code and N3 and P3 are the positive and negative sets from the 3-bit to 2 symbol code.

Figure 3C:
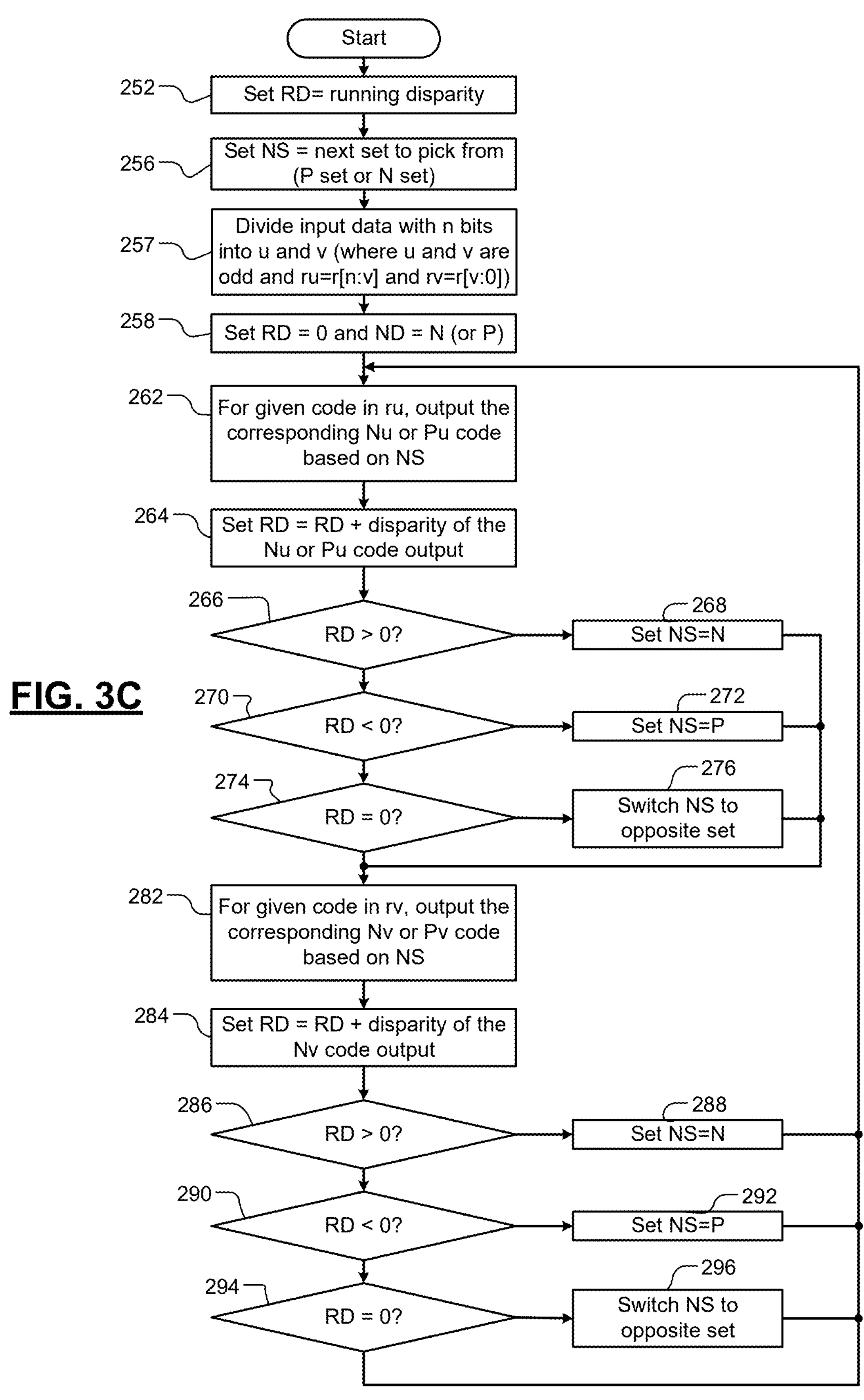
FIG. 3C is a flowchart of a method for encoding input signals including an even number of bits by splitting the input signals into two input codes each with an odd number of bits to improve DC balance by bounding disparity according to the present disclosure.

Referring now to FIG. 3C, a sequence of input data from the input set R with an even number of bits is mapped into two sets of PAM 4 symbols (e.g., ru and rv) (each with a P set and an N set). In other words, the given code in R with n bits (where n is even) is divided into two subsets including u bits and v bits (where u and v are odd and u+v=n). If possible, it is recommended that u and v differ by 1. For example, when n is equal to 8, u=5 and v=3 and r5=r[7:3] and r3=r[2:0]. The subsets r5=r [7:3] and r3=r[2:0] are handled in a manner similar to FIGS. 3A and 3B.

In FIG. 3C, the variables are defined at 252 and 256 where RD is set equal to running disparity and NS is defined as the next set to select (either Nu or Nv for the N set or Pu or Pv for the P set). respectively. At 258, RD is set equal to 0 and NS is set equal to N (NS can also be initialized to P). At 262, the process is applied for ru (e.g., r5=r[7:2]).

The method outputs the corresponding code to ru (e.g., r5) from the set specified by Nu (e.g., N5) if NS=N or Pu (e.g., P5) if NS=P. At 264, RD is set equal to RD+disparity of the code output by Nu (e.g., N5) or Pu (e.g., P5) as determined by NS. At 266, the method determines whether RD is positive. If 266 is true, then NS=N at 268 and the method continues at 282. If 266 is false, the method determines whether RD is negative at 270. If 270 is true, then NS=P at 272 and the method continues at 282. If 270 is false, the method determines whether RD=0 at 274. If 274 is true, the method switches NS to the opposite set and the method continues at 282. In some examples, the method does not switch when RD=0.

At 282, the same process is used for rv (e.g., r2=r[2:0]) from Nv (e.g., N2) or Pv (e.g., P2). The method outputs the corresponding code to rv (e.g., r2) from the set specified by Nv (e.g., N2) if NS=N or Pv (e.g., P2) if NS=P. At 284, RD is set equal to RD+disparity of the code output by N2 or P2. At 286, the method determines whether RD is positive. If 286 is true, then NS=N at 288 and the method returns to 262. If 286 is false, the method determines whether RD is negative at 290. If 290 is true, then NS=P at 292 and the method returns to 262. If 290 is false, the method determines whether RD=0 at 294. If 294 is true, the method switches NS to the opposite set at 296 and the method returns to 262. In some examples, the method does not switch when RD=0.

Figure 4A:
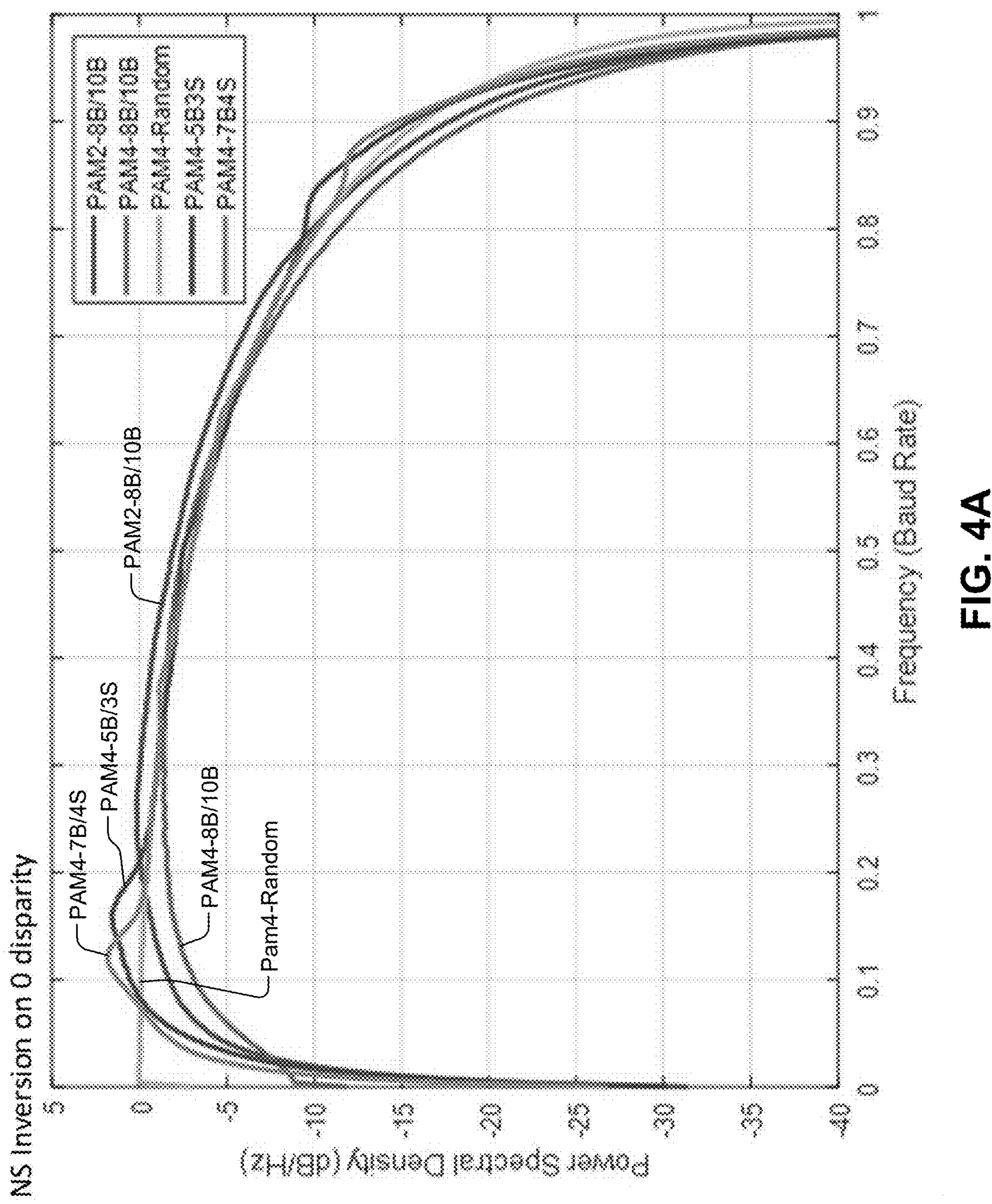
FIGS. 4A and 4B are graphs illustrating encoding with inversion when disparity is zero and without inversion when disparity is zero, respectively, according to the present disclosure.
Figure 4B:
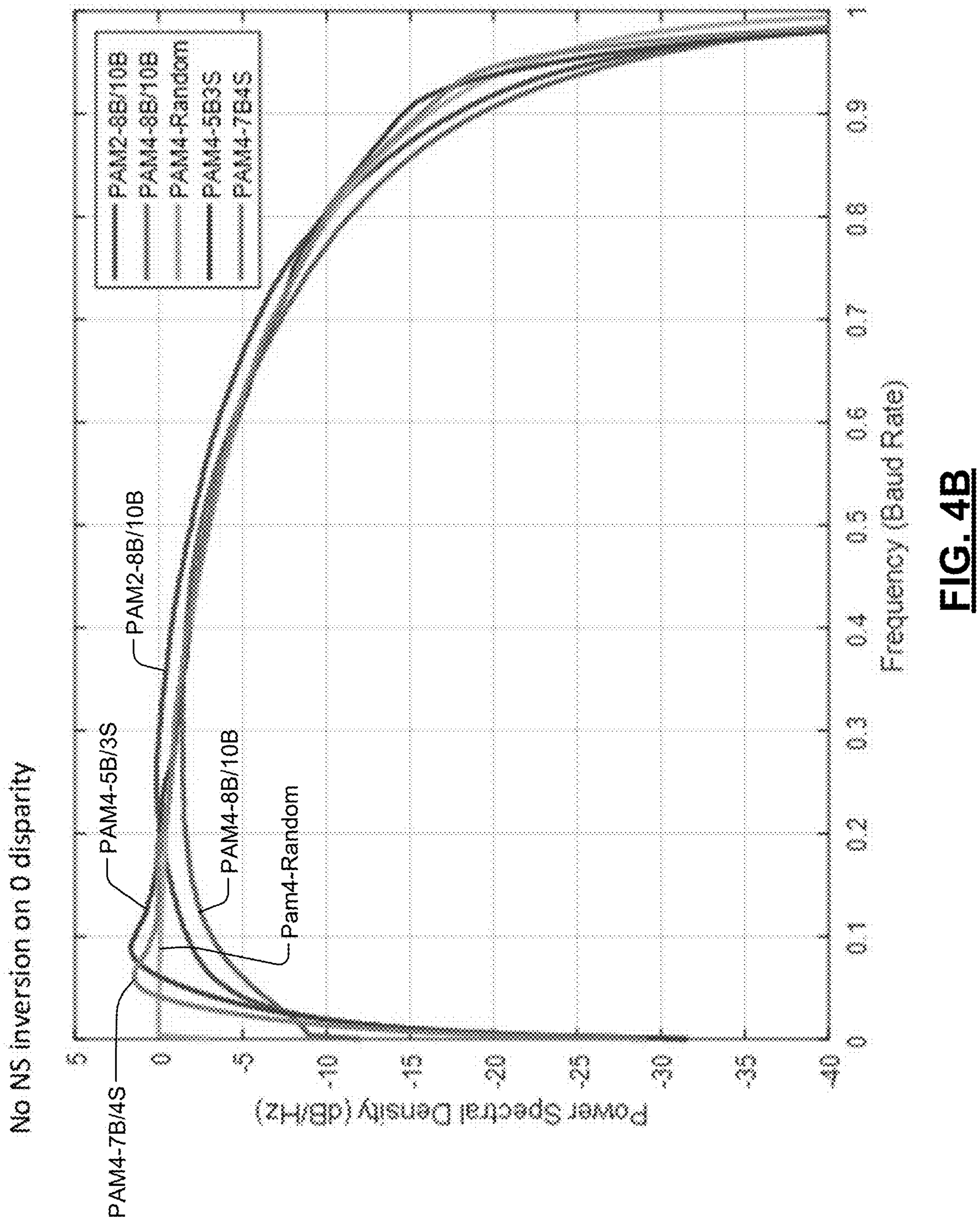

In FIGS. 3A and 3C, NS is set to the opposite set when the RD is 0. A variation on this would be to leave NS unchanged as described in FIG. 3B above. The effect is to push the energy slightly lower frequencies as can be seen in FIGS. 4A and 4B.

Selection of n

In error correction codes where protection is on the symbol level such as Reed Solomon codes, the value of n should be selected to match the number of bits in the symbol. For example in a Reed Solomon code in GF($2^7$), a 7-bit to 4-symbol mapping can be used since corruption of any of the 4 symbols results in an incorrect 7-bit at the output.

Figures 5, 6:
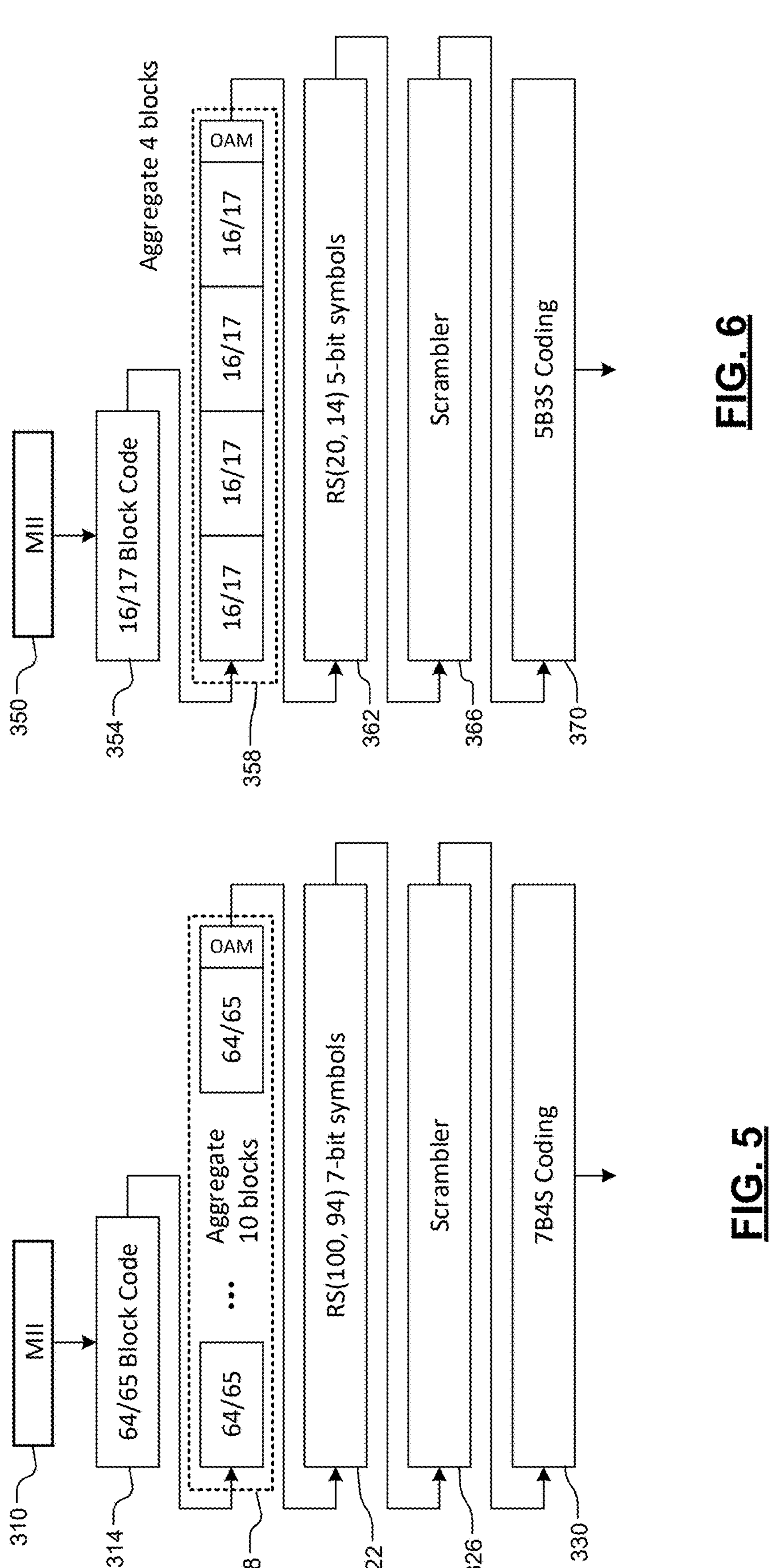
FIGS. 5 and 6 are functional block diagrams of encoding performed on an output of media independent interfaces according to the present disclosure.

Referring now to FIGS. 5 and 6, examples of coding of data from media independent interfaces (MII) interfaces are shown. In FIG. 5, a MII interface 310 outputs a 64/65 block code 314 to an aggregator 318 that aggregates 10 blocks. A Reed Solomon encoder 322 (e.g., RS(100,94)) generates 7 bit symbols. A scrambler 326 scrambles the 7 bit symbols. An encoder 330 enforces disparity bounds as described above by performing 7 bit to 4 symbol (7B4S) encoding.

In FIG. 6, a MII interface 310 outputs a 16/17 block code 354 to an aggregator 358 that aggregates 4 blocks. A Reed Solomon encoder 362 (e.g., RS(20,14)) generates 5 bit symbols. A scrambler 366 scrambles the 5 bit symbols. An encoder 370 enforces disparity bounds as described above by performing 5 bit to 3 symbol (5B3S) encoding.

The discussion above permits any R to N mapping (and by inference R to P given the fixed N to P relationship) as long as the mapping is one to one. The following description illustrates a 5-bit to 3 symbol code and a 7-bit to 4 symbol code that are efficient to implement.

5-Bit to 3-Symbol Mapping

Figures 7, 8, 9, 10:
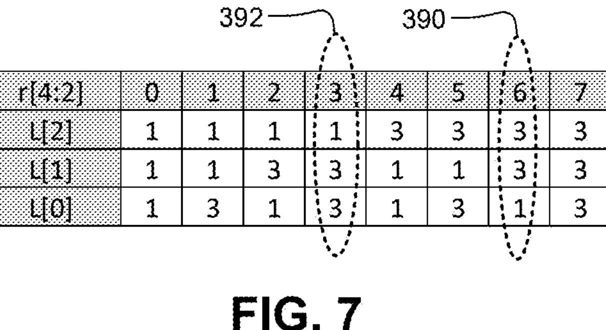

Referring now to FIGS. 7 and 8, (n+1)/2 bits are taken from r in R and mapped into $2^{(n+1)/2}$ unique codes using +1 and +3 for each symbol in set L. In this example, r [4:2] was chosen with r[4] →L[2], r[3]→L[1], r[2]→L[0] and {0, 1} from r[*] mapping into {+1, +3} in L[*]. So, for r[4:2]=6 (at dotted lines 390 in FIG. 7), the corresponding L[2:0]={+3, +3, +1}.

In FIG. 8, for the remaining (n−1)/2 bits of r (e.g., r[1:0] in the example), the table in FIG. 8 with (n−1)/2 rows and (n+1)/2 columns is used. The number in each cell represents a (n+1)/2 bit binary number whose bits represent a tuple {Q[(n−1)/2], . . . , Q[1], Q[0]}, where 0→+1 and 1→−1. In the example below r[1:0]=3→Q[2:0]={+1, −1, −1}.

The (n+1)/2 output code S[2:0] is constructed by symbol-wise multiplying L and Q. In the example r=13 (or 01101) then r[4:2]=011→L[2:0]={+1, +3, +3} (at dotted lines 392 in FIG. 7), r[4:0]=01101→Q[2:0]={+1, +1, −1}. Hence S[2:0]={+1, +3, −3} and the disparity is +1.

FIG. 9 shows the calculated disparity. Not all of the values are non-negative so the r to Q mapping table is changed. In FIG. 10, the bits in the r to Q table with a negative disparity are inverted, which results in all disparities being positive as shown in FIG. 11.

Figures 11, 12:
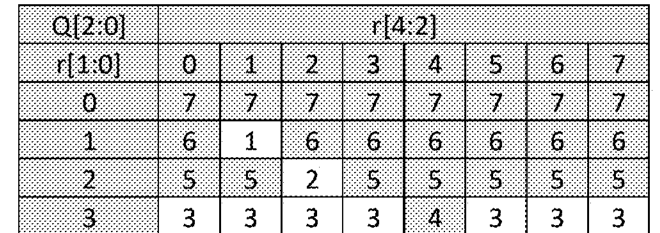

The set of codes generated by the r to Q table in FIG. 11 are in the set P. Inverting the bits in the r to Q table in FIG. 10 results in the table in FIG. 12. The set of codes generated by the r to Q table in FIG. 12 are in the set N. The resulting table of expanded S[2:0] for set N and set P are shown below. Other portions of the table are generated using a similar approach.

The r[4:2]→L[2:0] involves selecting +1 or +3 based on whether r[*] is 0 or 1. The r to Q table for set P involves mapping 0→0, 1→1, 2→2, 3→4 with the exception at r[4:0]=5 and r[4:0]=6 where they are mapped to 6 and 5, respectively. The r to Q table for set N is simply the bit inversion of set P. The decoding Q to r mapping is simple with no exceptions since both set P and set N map to r.

In the example above, Q[1]→r[1] and Q[0]→r[0] where if Q[2]=+1 then {+1, −1}→{0, 1} and if Q[2]=−1 then {+1, −1}→{1, 0}. The 5 bit to 3 symbol mapping is shown in FIG. 13.

7-Bit to 4-Symbol Mapping

In this example there is the additional flexibility of a code's disparity being zero. In FIGS. 14, r[6:3] to L[0:4] mapping is shown. {0, 1} of each bit position in r is mapped to {+1, +3} in L as shown. The r to Q table is shown in FIG. 15. The disparity is shown in FIG. 16.

In FIG. 17, some of the highlighted cells are inverted to remove negative disparity. The codes with 0 disparity in FIG. 18 can have the r to Q table adjusted to reduce the logic needed to implement.

The cells with that are circled in FIG. 19 shows the codes with 0 disparity where adjustments are made. In this example, a mirror image for rows 3, 5, and 6 is selected. This is the r to Q table to generate set P. The bit inverted version of the table in FIG. 19 results in the set N table in FIG. 20. The fully expanded 7-bit 4-symbol mapping is shown in FIGS. 21A to 21D.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A communications device, comprising:

a mapping module configured to selectively map a plurality of n-bit signals to a plurality of (n+1)/2 symbols using one of:

a first set of symbols having one of a positive disparity and a zero disparity; and a second set of symbols each having one of a negative disparity and a zero disparity, wherein n is an integer; and an encoder configured to:

a) select one of the first set of symbols and the second set of symbols as a next symbol set of the mapping module;

b) encode a first one of the plurality of n-bit signals using the next symbol set of the mapping module;

c) calculate a running disparity;

d) if the running disparity is greater than zero, select the second set of symbols of the mapping module as the next symbol set; and e) if the running disparity is less than zero, select the first set of symbols of the mapping module as the next symbol set.

2. The communications device of claim 1, wherein n is odd.

3. The communications device of claim 1, wherein the encoder is further configured to:

f) repeat (a) to (e) for other ones of the plurality of n-bit signals.

4. The communications device of claim 1, wherein when the running disparity is equal to zero, the encoder is further configured to:

f) switch to the other one of the first set of symbols and the second set of symbols as the next symbol set of the mapping module.

5. The communications device of claim 1, wherein each of the plurality of n-bit signals maps to a unique set of symbols in the first set of symbols and a unique set of symbols in the second set of symbols.

6. The communications device of claim 1, wherein signals levels of corresponding ones of the symbols in the first set of symbols and the second set of symbols have the same magnitude but different polarity.

7. The communications device of claim 1, wherein the (n+1)/2 symbols are greater than two.

8. The communications device of claim 1, wherein n equals 5 and the (n+1)/2 symbols equal 3.

9. The communications device of claim 1, wherein n equals 7 and the (n+1)/2 symbols equal 4.

10. The communications device of claim 1, further comprising:

a media independent interface configured to output data blocks;

an aggregator configured to aggregate a plurality of the data blocks;

an error encoder configured to generate error encoded data; and a scrambler configured to scramble the error encoded data to generated scrambled data corresponding to the n-bit signals.

11. The communications device of claim 10, wherein the error encoder comprises a reed Solomon encoder.

12. The communications device of claim 10, wherein the data blocks comprise 64/65 data blocks and the error encoder outputs 7-bit symbols.

13. The communications device of claim 10, wherein the data blocks comprise 16/17 data blocks and the error encoder outputs 5-bit symbols.

14. A communications device, comprising:

a mapping module configured to:

map a plurality of u-bit signals into a plurality of (n+1)/2 symbols using one of a first set of symbols having one of a positive disparity and a zero disparity, and a second set of symbols each having one of a negative disparity and a zero disparity;

map a plurality of v-bit signals into the plurality of (n+1)/2 symbols using one of a third set of symbols having one of a positive disparity and a zero disparity, and a fourth set of symbols each having one of a negative disparity and a zero disparity; and an encoder configured to:

a) divide a plurality of n-bit signals into the plurality of u-bit signals and the plurality of v-bit signals, where n, u and V are integers;

b) select one of the first set of symbols and the second set of symbols as a next symbol set of the mapping module;

c) encode a first one of the plurality of u-bit signals using the next symbol set of the mapping module;

d) calculate a running disparity;

e) if the running disparity is greater than zero, select the second set of symbols of the mapping module as the next symbol set;

f) if the running disparity is less than zero, select the first set of symbols of the mapping module as the next symbol set;

g) select one of the third set of symbols and the fourth set of symbols as a next symbol set of the mapping module;

h) encode a first one of the plurality of v-bit signals using the next symbol set of the mapping module;

i) calculate the running disparity;

j) if the running disparity is greater than zero, selecting the fourth set of symbols of the mapping module as the next symbol set; and k) if the running disparity is less than zero, selecting the third set of symbols of the mapping module as the next symbol set.

15. The communications device of claim 14, wherein:

n is an even integer; and u and v are odd integers.

16. The communications device of claim 14, wherein the encoder is further configured to:

f) repeating (a) to (k) for other ones of the plurality of n-bit signals.

17. The communications device of claim 14, wherein:

when the running disparity is equal to zero after f), the encoder is further configured to switch to the other one of the first set of symbols and the second set of symbols as the next symbol set of the mapping module; and when the running disparity is equal to zero after k), the encoder is further configured to switch to the other one of the third set of symbols and the fourth set of symbols as the next symbol set of the mapping module.

18. The communications device of claim 14, wherein each of the plurality of u-bit signals maps to a unique set of symbols in the first set of symbols and a unique set of symbols in the second set of symbols.

19. The communications device of claim 18, wherein each of the plurality of v-bit signals maps to a unique set of symbols in the third set of symbols and a unique set of symbols in the fourth set of symbols.

20. The communications device of claim 14, wherein signals levels of corresponding ones of the symbols in the first set of symbols and the second set of symbols have the same magnitude but different polarity.

21. The communications device of claim 20, wherein signals levels of corresponding ones of the symbols in the third set of symbols and the fourth set of symbols have the same magnitude but different polarity.

22. The communications device of claim 14, wherein the (n+1)/2 symbols are greater than two.

23. The communications device of claim 14, further comprising:

a media independent interface configured to output data blocks;

an aggregator configured to aggregate a plurality of the data blocks;

an error encoder configured to generate error encoded data; and a scrambler configured to scramble the error encoded data to generated scrambled data corresponding to the n-bit signals.

24. The communications device of claim 23, wherein the error encoder comprises a reed Solomon encoder.

25. A method for operating a communications device, comprising:

a) selectively mapping a plurality of n-bit signals to a plurality of (n+1)/2 symbols using one of:

a first set of symbols having one of a positive disparity and a zero disparity; and a second set of symbols each having one of a negative disparity and a zero disparity, wherein n is an integer; and b) selecting one of the first set of symbols and the second set of symbols as a next symbol set;

c) encoding a first one of the plurality of n-bit signals using the next symbol set;

d) calculating a running disparity;

e) if the running disparity is greater than zero, selecting the second set of symbols as the next symbol set; and f) if the running disparity is less than zero, selecting the first set of symbols as the next symbol set.

26. The method of claim 25, wherein n is odd.

27. The method of claim 25, further comprising:

g) repeating (b) to (f) for other ones of the plurality of n-bit signals.

28. The method of claim 25, further comprising:

g) when the running disparity is equal to zero, switching to the other one of the first set of symbols and the second set of symbols as the next symbol set.

29. The method of claim 25, wherein each of the plurality of n-bit signals maps to a unique set of symbols in the first set of symbols and a unique set of symbols in the second set of symbols.

30. The method of claim 25, wherein signals levels of corresponding ones of the symbols in the first set of symbols and the second set of symbols have the same magnitude but different polarity.

31. The method of claim 25, wherein the (n+1)/2 symbols are greater than two.

32. The method of claim 25, wherein n equals 5 and the (n+1)/2 symbols equal 3.

33. The method of claim 25, wherein n equals 7 and the (n+1)/2 symbols equal 4.

34. A method for operating a communications device, comprising:

a) mapping a plurality of u-bit signals into a plurality of (n+1)/2 symbols using one of a first set of symbols having one of a positive disparity and a zero disparity, and a second set of symbols each having one of a negative disparity and a zero disparity;

b) mapping a plurality of v-bit signals into the plurality of (n+1)/2 symbols using one of a third set of symbols having one of a positive disparity and a zero disparity, and a fourth set of symbols each having one of a negative disparity and a zero disparity; and c) dividing a plurality of n-bit signals into the plurality of u-bit signals and the plurality of v-bit signals, where n, u and V are integers;

d) selecting one of the first set of symbols and the second set of symbols as a next symbol set;

e) encoding a first one of the plurality of u-bit signals using the next symbol set;

f) calculating a running disparity;

g) if the running disparity is greater than zero, select the second set of symbols as the next symbol set;

h) if the running disparity is less than zero, select the first set of symbols as the next symbol set;

i) selecting one of the third set of symbols and the fourth set of symbols as a next symbol set;

j) encoding a first one of the plurality of v-bit signals using the next symbol set;

k) calculating the running disparity;

l) if the running disparity is greater than zero, selecting the fourth set of symbols as the next symbol set; and m) if the running disparity is less than zero, selecting the third set of symbols as the next symbol set.

35. The method of claim 34, wherein:

n is an even integer; and u and v are odd integers.

36. The method of claim 34, further comprising:

n) repeating (a) to (m) for other ones of the plurality of n-bit signals.

37. The method of claim 34, further comprising:

when the running disparity is equal to zero after h), switching to the other one of the first set of symbols and the second set of symbols as the next symbol set; and when the running disparity is equal to zero after m), switching to the other one of the third set of symbols and the fourth set of symbols as the next symbol set.

38. The method of claim 34, wherein:

each of the plurality of u-bit signals maps to a unique set of symbols in the first set of symbols and a unique set of symbols in the second set of symbols; and each of the plurality of v-bit signals maps to a unique set of symbols in the third set of symbols and a unique set of symbols in the fourth set of symbols.

39. The method of claim 34, wherein:

signals levels of corresponding ones of the symbols in the first set of symbols and the second set of symbols have the same magnitude but different polarity; and signals levels of corresponding ones of the symbols in the third set of symbols and the fourth set of symbols have the same magnitude but different polarity.

40. The method of claim 34, wherein the (n+1)/2 symbols are greater than two.

* * * * *